(12) United States Patent
Xi et al.

(10) Patent No.: US 10,460,656 B2
(45) Date of Patent: Oct. 29, 2019

(54) DISPLAY PANEL AND DISPLAY DEVICE

(71) Applicant: SHANGHAI TIANMA AM-OLED CO., LTD., Shanghai (CN)

(72) Inventors: Kerui Xi, Shanghai (CN); Tingting Cui, Shanghai (CN); Juan Zhu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 10 days.

(21) Appl. No.: 15/907,288

(22) Filed: Feb. 28, 2018

(65) Prior Publication Data

US 2018/0190190 A1 Jul. 5, 2018

(30) Foreign Application Priority Data

Sep. 8, 2017 (CN) .......................... 2017 1 0807090

(51) Int. Cl.
  *G09G 3/36* (2006.01)
  *G09G 3/3225* (2016.01)
  *G09G 3/3208* (2016.01)

(52) U.S. Cl.
  CPC ......... *G09G 3/3225* (2013.01); *G09G 3/3208* (2013.01); *G09G 2300/0413* (2013.01); *G09G 2300/0426* (2013.01); *G09G 2300/0819* (2013.01); *G09G 2310/0232* (2013.01); *G09G 2310/0267* (2013.01); *G09G 2310/0281* (2013.01); *G09G 2310/0283* (2013.01); *G09G 2310/0286* (2013.01)

(58) Field of Classification Search
  CPC .......... G09G 3/36; G11C 19/00; G02F 1/1345
  See application file for complete search history.

(56) References Cited

U.S. PATENT DOCUMENTS

| | | | | |
|---|---|---|---|---|
| 2006/0061535 | A1* | 3/2006 | Kim ..................... | G09G 3/3677 345/98 |
| 2007/0075954 | A1* | 4/2007 | Oh ....................... | G09G 3/3258 345/92 |
| 2012/0114092 | A1* | 5/2012 | Kim ..................... | G11C 19/28 377/69 |
| 2017/0249896 | A1* | 8/2017 | Kim ..................... | G09G 3/3225 |

(Continued)

FOREIGN PATENT DOCUMENTS

| | | |
|---|---|---|
| CN | 103149757 A | 6/2013 |
| CN | 104765215 A | 7/2015 |
| CN | 105654886 A | 6/2016 |

(Continued)

*Primary Examiner* — Pegeman Karimi
(74) *Attorney, Agent, or Firm* — Kilpatrick Townsend & Stockton, LLP

(57) ABSTRACT

Disclosed are a display panel and a display device. A middle area is arranged between the first subarea and the second subarea so that components such as a camera and a receiver can be arranged at corresponding positions in the middle area. First driving signal lines only extend along the row direction of the pixels to the edge of the first subarea close to the middle area and second driving signal lines only extend to the edge of the second subarea close to the middle area. A first driving circuit is arranged in the first subarea to drive the first driving signal lines to operate and a second driving circuit is arranged in the second subarea to drive the second driving signal lines to operate.

24 Claims, 15 Drawing Sheets

(56) References Cited

U.S. PATENT DOCUMENTS

2017/0251137 A1* 8/2017 Evans, V ............. H04N 5/2252

FOREIGN PATENT DOCUMENTS

| CN | 106406612 A | 2/2017 |
| CN | 106504696 A | 3/2017 |
| CN | 106992188 A | 7/2017 |
| CN | 107134473 A | 9/2017 |

* cited by examiner

DISPLAY PANEL AND DISPLAY DEVICE

CROSS-REFERENCE TO RELATED APPLICATIONS

This application claims the priority to Chinese Patent Application No. CN201710807090.9, filed on Sep. 8, 2017, the content of which is hereby incorporated by reference in its entirety.

FIELD

The present disclosure relates to the technical field of displaying, in particular to a display panel and a display device.

BACKGROUND

With development of display technologies, compared with a regular screen, a full screen, with a large screen-to-body ratio and ultra-narrow border, can greatly enhance view experience of viewers, thus drawing a widespread attention. At present, in a display device adopting a full screen such as a mobile phone, a front camera, a receiver, a fingerprint recognition area or a physical button is usually arranged on the front side of the display device in order for a user to take a selfie, to make a video call or to use a fingerprint for authentication. As shown by FIG. 1, which is a structural schematic diagram of a display panel, a front camera 10 and a receiver 20 are usually arranged in a non-display area at the top of the display panel; a fingerprint recognition area or a physical button 30 are generally arranged in a non-display area at the bottom of the display panel, which limits a further increase of the screen-to-body ratio of the display panel.

SUMMARY

The embodiments of the present disclosure provide a display panel and a display device to solve the existing problem disadvantageous to the design of a narrow bezel.

Therefore, an embodiment of the present disclosure provides a display panel. The display panel includes a first area and a second area. The first area includes a middle area, a first subarea and a second subarea separated by the middle area.

The first subarea includes at least two pixels, one or more first driving signal lines extending in a row direction of the pixels and a first driving circuit. One end of at least one of the first driving signal lines is electrically connected to the first driving circuit and the other end of the first driving signal line extends to an edge of the first subarea close to the middle area. The first driving circuit is configured to drive the first driving signal lines in the first subarea.

The second subarea includes at least two pixels, one or more second driving signal lines extending in a row direction of the pixels and a second driving circuit. One end of at least one of the second driving signal lines is electrically connected to the second driving circuit and the other end of the second driving signal line extends to an edge of the second subarea close to the middle area. The second driving circuit is configured to drive the second driving signal lines located in the second subarea.

Correspondingly, an embodiment of the present disclosure further provides a display device. The display device includes a display panel including a first area and a second area. The first area includes a middle area, a first subarea and a second subarea, the first subarea and the second subarea are separated by the middle area. The first subarea includes at least two pixels, one or more first driving signal lines extending in a row direction of the pixels and a first driving circuit. One end of at least one of the first driving signal lines is electrically connected to the first driving circuit and the other end of the first driving signal line extends to an edge of the first subarea close to the middle area; and the first driving circuit is configured to drive the first driving signal lines located in the first subarea. The second subarea includes at least two pixels, a second driving signal line extending in the row direction of the pixels and a second driving circuit. One end of at least one of the second driving signal lines is electrically connected to the second driving circuit and the other end of the second driving signal line extends to an edge of the second subarea close to the middle area; and the second driving circuit is configured to drive the second driving signal lines located in the second subarea.

DETAILED DESCRIPTION OF THE EMBODIMENTS

Figure 1:
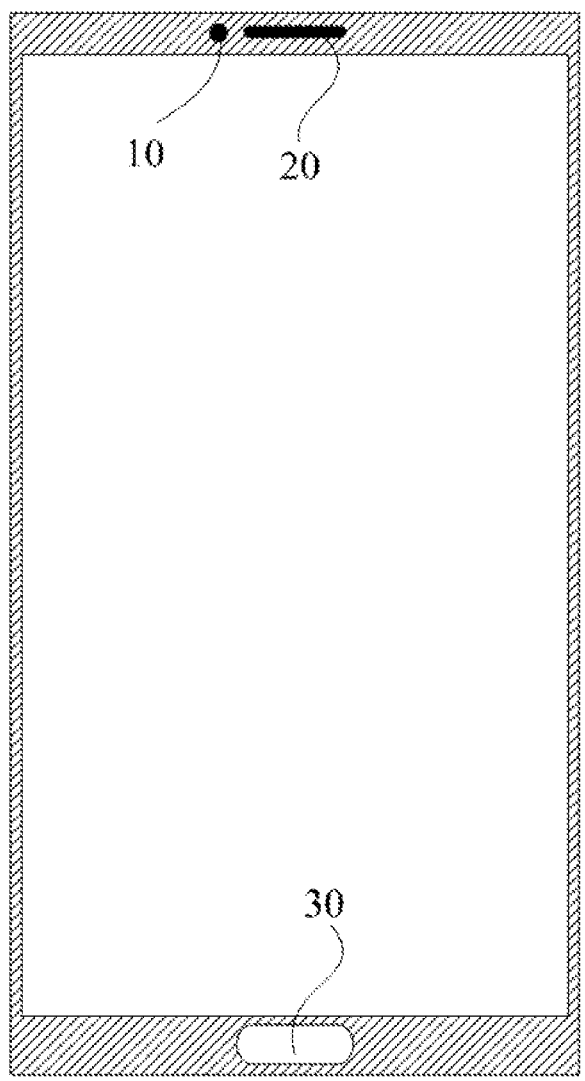
FIG. 1 is a structural schematic diagram of a related display panel.

Implementation modes of display panels and display devices according to embodiments of the present disclosure are described below in detail with reference to the accompanying drawings. It should be understood that the embodiments described below are only for illustrating and explaining the present disclosure, but are not intended to limit the present disclosure. Embodiments of the disclosure and the features in the embodiments can be combined in any way which does not create a conflict.

The size, thickness and shape of each component in the drawings do not reflect a true scale of the display panel, and are merely intended to illustrate the content of the present disclosure.

Figure 2:
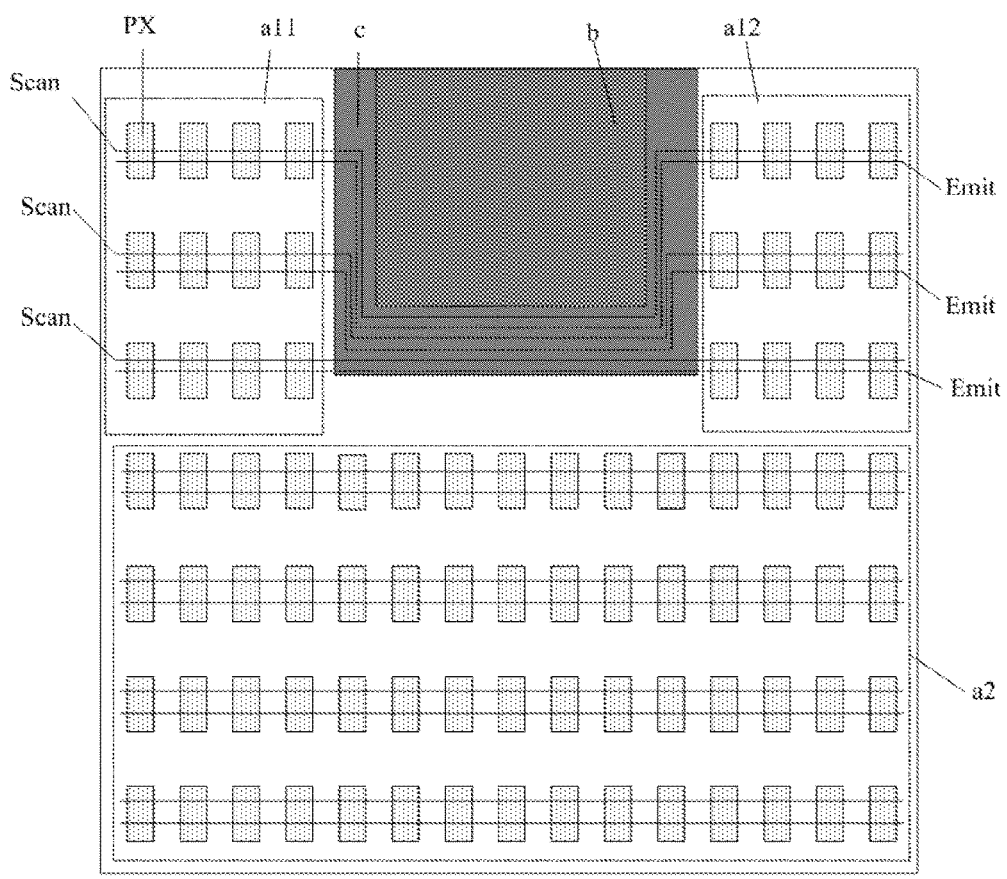
FIG. 2 is a structural schematic diagram of a display panel in comparison with a display panel according to an embodiment of the present disclosure.

As shown in FIG. 2 illustrating the structure of a display panel, a component such as a front camera or a receiver, may be arranged in a particular area b. However, in order to arrange the component such as the front camera or the receiver, in an actual manufacturing process, the particular area b is usually cut off, so gate lines Scan for driving same rows of pixels PX in a first display area a11 and in a second display area a12 and light emitting control signal lines Emit need to be arranged in an area c between the particular area b and the first display area a11, between the particular area b and the second display area a12, and between the particular area b and a second area a2 such that the area c is arranged on the display device as a bezel area of the display panel. However, in a practical implementation, generally, many rows of pixels, for example 80 rows of pixels, are arranged in the first display area a11 and in the second display area a12. Then when each row of pixels corresponds to one gate line Scan and one light emitting control signal line Emit, it causes 80 gate lines Scan and 80 light emitting control signal lines Emit, i.e., 160 signal lines, to be arranged in the area c, which functions as a bezel area. When each row of pixels corresponds to two gate lines and one light emitting control signal line, it causes 160 gate lines and 80 light emitting control signal lines, i.e., 240 signal lines, to be arranged in the area c, which functions as a bezel area. When more gate lines and light emitting control signal lines are correspondingly arranged in each row of pixels, it is necessary to arrange more signal lines in the area c, which functions as a bezel area, resulting in an increase of the size of the area c, which is not desired for the narrow bezel design of the display panel.

Figure 3:
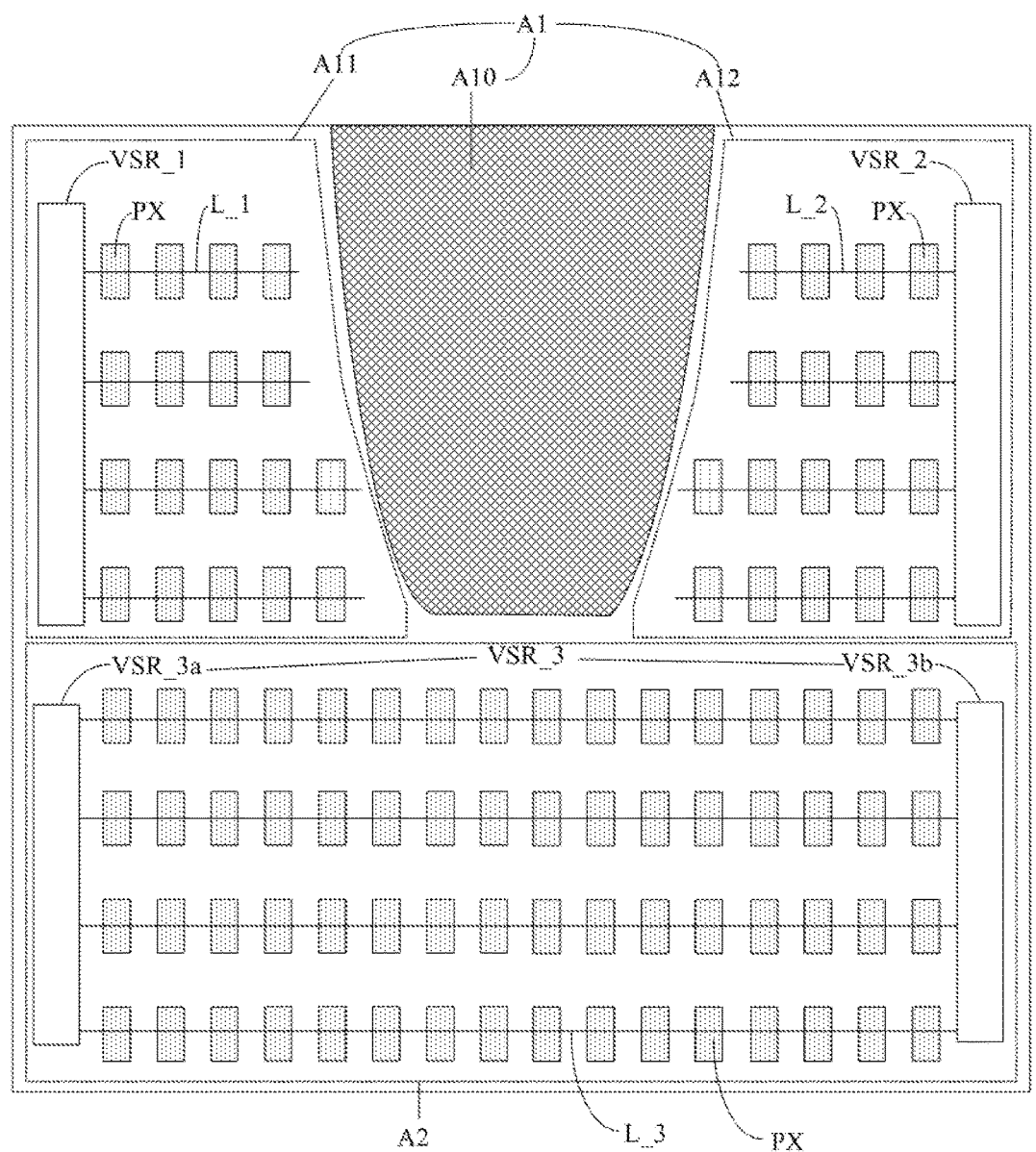
FIG. 3 is a structural schematic diagram of a display panel according to an embodiment of the present disclosure.

An embodiment of the present disclosure provides a display panel. As shown in FIG. 3, the display panel includes a first area A1 and a second area A2. The first area A1 includes a middle area A10, and a first subarea A11 and a second subarea A12 separated by the middle area A10.

The first subarea A11 includes at least two pixels PX, one or more first driving signal lines $L\_1$ extending in a direction parallel to a direction in which a row of the pixels PX extends, and a first driving circuit $VSR\_1$. One end of at least one of the first driving signal lines $L\_1$ is electrically connected to the first driving circuit $VSR\_1$, and the other end of the first driving signal line $L\_1$ extends to an edge of the first subarea A11 closet to the middle area A10. The first driving circuit $VSR\_1$ is configured to drive the first driving signal lines $L\_1$ in the first subarea A11. The edge of the first subarea A11 close to the middle area A10 is an area in the first subarea A11 near the middle area A10.

The second subarea A12 includes at least two pixels PX, one or more second driving signal lines $L\_2$ extending in a direction parallel to a direction in which a row of the pixels PX extends and a second driving circuit $VSR\_2$. One end of at least one of the second driving signal lines $L\_2$ is electrically connected to the second driving circuit $VSR\_2$, and the other end of the second driving signal line $L\_2$ extends to an edge of the second subarea A12 close to the middle area A10. The second driving circuit $VSR\_2$ is configured to drive the second driving signal lines $L\_2$ in the second subarea A12. The edge of the second subarea A12 close to the middle area A10 is an area in the second subarea A12 near the middle area A10.

In the display panel according to the embodiments of the present disclosure, since the middle area is arranged between the first subarea and the second subarea, when the display panel is applied to the display device, components such as a front camera and a receiver can be arranged at corresponding positions in the middle area, so that the screen-to-body ratio of the display panel can be increased compared with that of an existing display panel. Furthermore, in the display panel according to the embodiments of the present disclosure, the first driving signal line in the first subarea only extends along the row direction of the pixels to the edge of the first subarea close to the middle area, and the second driving signal line in the second subarea only extends to the edge of the second subarea close to the middle area. Since the first subarea and the second subarea are separated by the middle area so that the first subarea and the second subarea are not adjacent to each other, the first driving signal line and the second driving signal line can be insulated from each other and can be only arranged in the first subarea and the second subarea, respectively, without occupying an area between the first subarea and the middle area, between the second subarea and the middle area, or between the second area and the middle area. Moreover, the first driving circuit is arranged in the first subarea to drive the first driving signal line to work and the second driving circuit is arranged in the second subarea to drive the second driving signal line to work, thereby ensuring that the first driving signal line and the second driving signal line can be driven to work normally. Therefore, compared with the display panel illustrated by FIG. 2, the embodiment of the disclosure can avoid a problem that in order to implement electrical connection for being driven to work normally, the first driving signal line and the second driving signal line occupy an extra non-display area configured to arrange a signal line between the middle area and the first subarea, between the middle area and the second subarea, or between the middle area and the second area, can reduce a size of occupied non-display area and can realize the narrow bezel design of the display panel.

A display panel usually adopts a substrate for arranging pixels. In one embodiment, the display panel according to the embodiment of the present disclosure further includes a substrate provided with pixels. The substrate may be a glass substrate, a flexible substrate or a silicon substrate, which is not limited herein. When the display panel is applied to a display device, a component such as a camera or a receiver is generally arranged too. In order to arrange a component such as a camera or a receiver, in one embodiment, in a display panel according to the embodiment of the present disclosure, the middle area is a hollow area of the substrate in the display panel. In the actual manufacturing process, the middle area of the substrate is cut off, so that a component such as a camera or a receiver is arranged in the display device. Alternatively the middle area is not cut off so that the middle area could be used as a protective cover for the component such as a camera or a receiver. In this case, the middle area may be configured as a non-voided area. For normal operation of the component, the non-voided area may be configured as a transparent display area or a transparent non-display area. Certainly, the configuration of the middle area of the display panel needs to be determined according to actual application environments of the display panel, which is not limited herein.

Figure 4A:
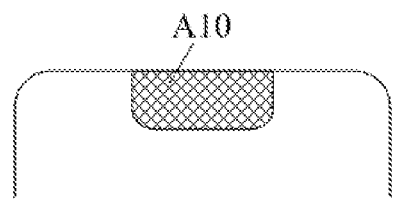
FIG. 4A is a structural schematic diagram of a display panel partially enlarged in a middle area according to an embodiment of the present disclosure.
Figure 4B:
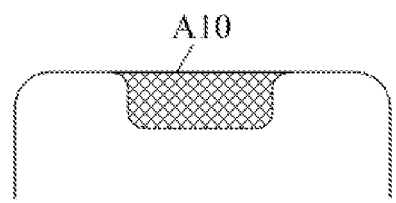
FIG. 4B is another structural schematic diagram of a display panel partially enlarged in a middle area according to an embodiment of the present disclosure.
Figure 4C:
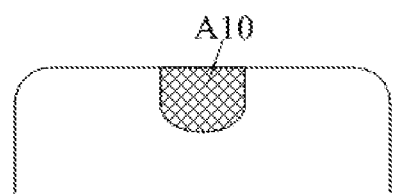
FIG. 4C is another structural schematic diagram of a display panel partially enlarged in a middle area according to an embodiment of the present disclosure.
Figure 4D:
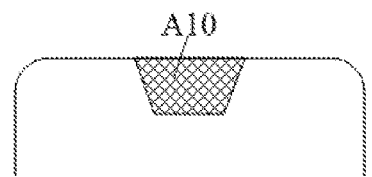
FIG. 4D is another structural schematic diagram of a display panel partially enlarged in a middle area according to an embodiment of the present disclosure.
Figure 4E:
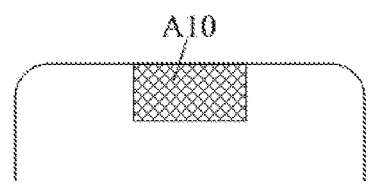
FIG. 4E is another structural schematic diagram of a display panel partially enlarged in a middle area according to an embodiment of the present disclosure.

In one embodiment, in the display panel according to the embodiment of the present disclosure, an outline of the middle area may be configured according to a shape of the component to be arranged in the middle area. For example, when multiple components are arranged in the middle area A10, as shown in FIG. 4e, the outline of the middle area A10 may be rectangular. Alternatively, when the edge profile of the component arranged in the middle area A10 is irregular, as shown in FIG. 3 to FIG. 4D, the middle area A10 may be a special-shaped area having a non-rectangular outline. For example, when the edge profile of the component such as a round camera arranged in the middle area A10 is an arc, as shown in FIG. 3, two edges of a rectangular area close to the first subarea A11 and to the second subarea A12, respectively, may be configured to be arcs to form the middle area A10 which has a special-shaped outline. Alternatively, as shown in FIG. 4A, only two rectangular corners of the rectangular area close to the second area are arranged into arcs to form the middle area A10 which has a special-shaped outline. Alternatively, as shown in FIG. 4B, four right angles of the rectangular area may be arranged into arcs to form the middle area A10 which has a special-shaped outline. Alternatively, as shown in FIG. 4c, an edge of the rectangular area close to the second area may also be arranged into an arc shape to form the middle area A10 which has a special-shaped outline. Alternatively, as shown in FIG. 4D, the special-shaped area may be a trapezoid to form the middle area A10. Of course, it is also possible to set the profile of the special-shaped area as a circular arc so as to form a middle area which has a circular arc outline. In practice, the outline of the middle area needs to be designed and determined according to the actual application environment of the display panel, which is not limited herein.

Figure 5A:
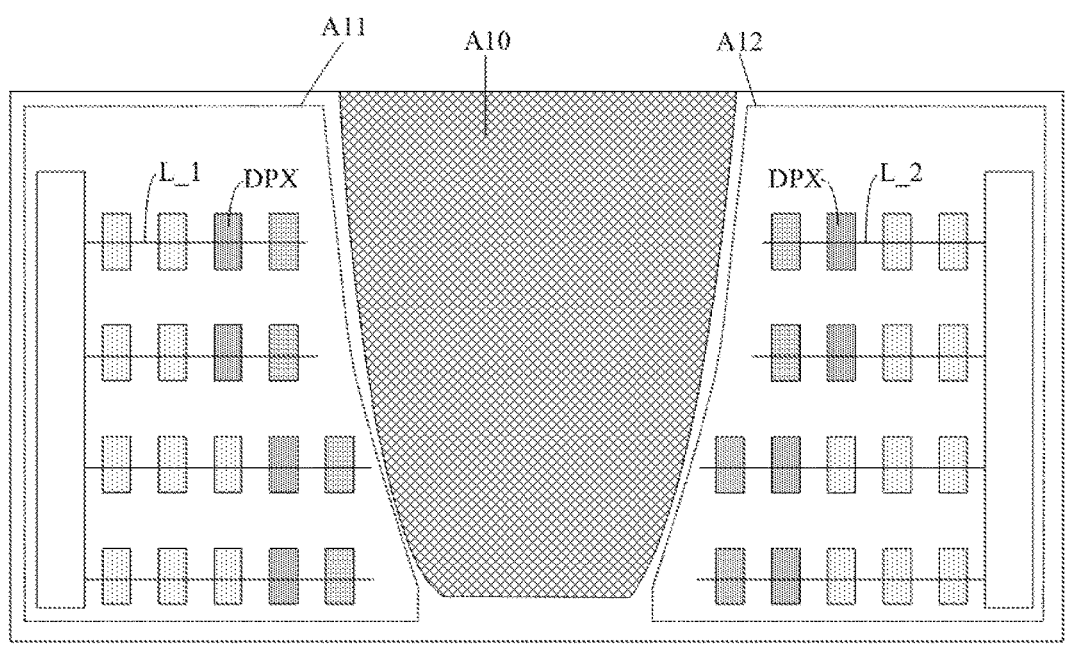
FIG. 5A is another structural schematic diagram of a display panel according to an embodiment of the present disclosure.
Figure 5B:
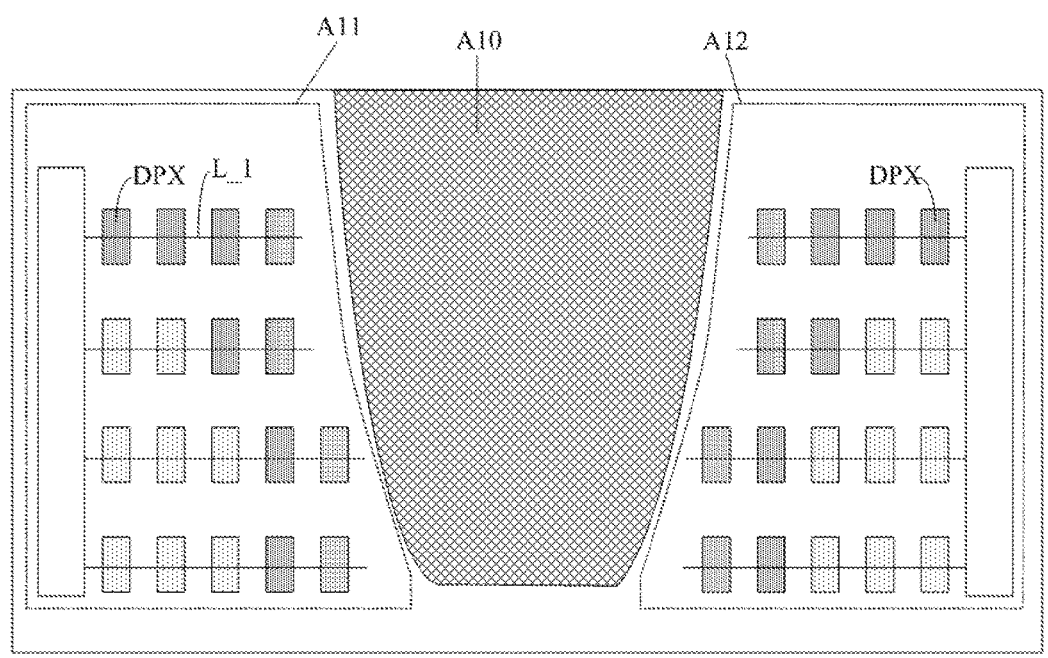
FIG. 5B is another structural schematic diagram of a display panel according to an embodiment of the present disclosure.
Figure 6:
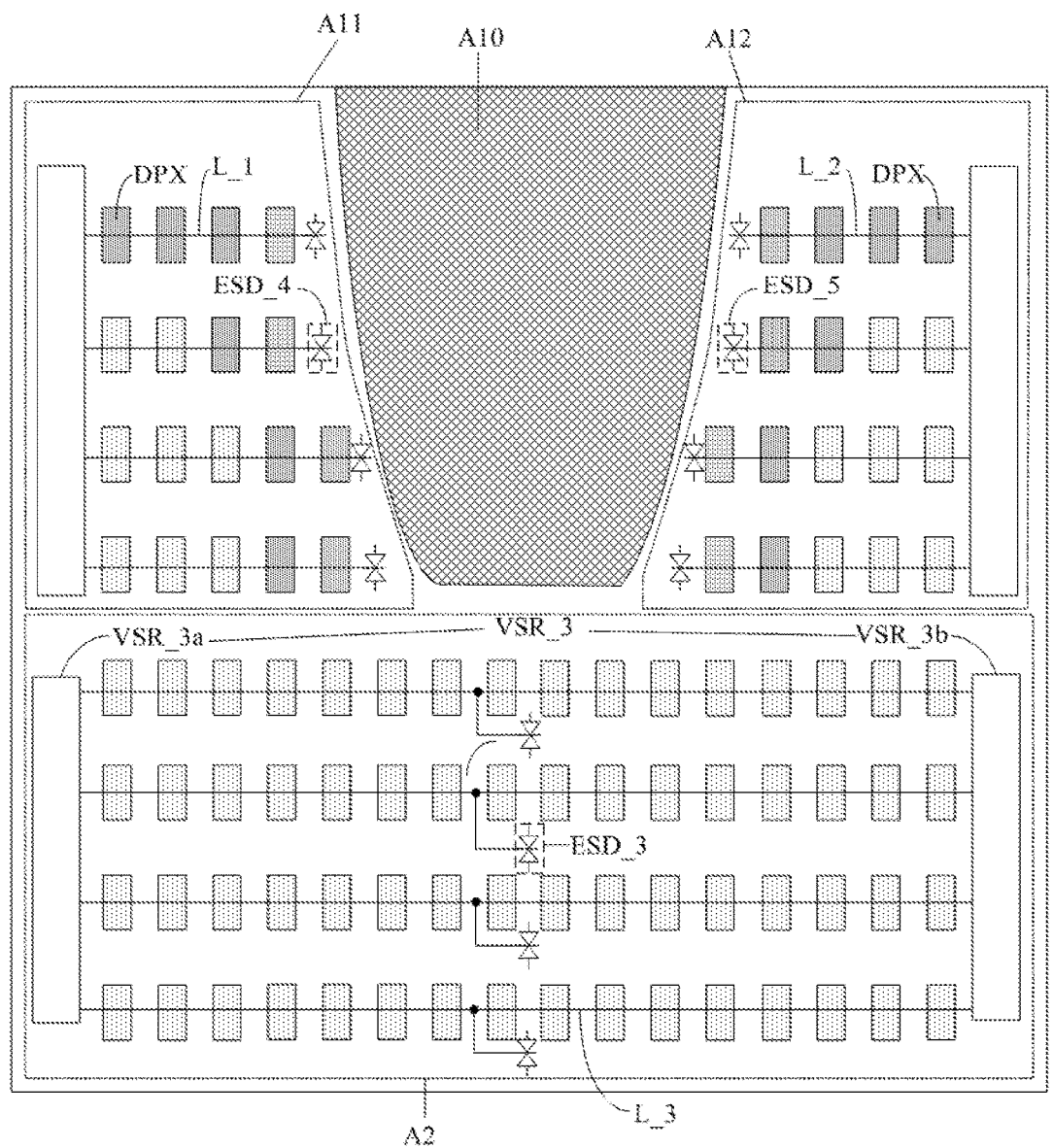
FIG. 6 is another structural schematic diagram of a display panel according to an embodiment of the present disclosure.

Generally, when a driving signal line transmits a driving signal, since its ends are greatly influenced by a coupling capacitor and a loading in the display panel, the signal transmitted to the ends of the driving signal lines fluctuates greatly, thereby affecting the display uniformity of the display panel. In order to improve the display uniformity of the display panel, in one embodiment, in the display panel according to the embodiment of the present disclosure, non-display dummy pixels DPX may be included at least at the edge of the first subarea A11 close to the middle area A10, and at least at the edge of the second subarea A12 close to the middle area A10, as shown in FIG. 5A to FIG. 6. Since non-display dummy pixels DPX are not used for light emitting display, they are arranged at ends of the first driving signal line L_1 and of the second driving signal line L_2 close to the middle area A10, respectively, so as to avoid the problem that the display effect is affected by the fluctuation caused by driving signals transmitted to the ends of the first driving signal line L_1 and of the second driving signal line L_2, thus further improving the display uniformity. In addition, a circuit is usually arranged in a pixel. In an actual manufacturing process, a circuit in a pixel close to an edge of the display area in the display panel generally has some difference from a circuit in a pixel in the display area. Non-display dummy pixels arranged on an edge of the display area could function as a buffer zone.

In one embodiment, in the display panel according to the embodiment of the present disclosure, non-display dummy pixels DPX may be included only at the edge of the first subarea A11 close to the middle area A10 and at the edge of the second subarea A12 close to the middle area A10, as shown in FIG. 5A. Alternatively, non-display dummy pixels DPX may be included at the edge of the first subarea A11 close to the middle area A10 and at the edge of the first subarea A11 away from the second area A2, as shown in FIG. 5B. And non-display dummy pixels DPX may be included at the edge of the second subarea A12 close to the middle area A10 and at the edge of the second subarea A12 away from the second area A2. Of course, configuration of non-display dummy pixels in the first subarea and in the second subarea needs to be designed and determined according to an actual application environment of the display panel, which is not limited herein.

In order to prevent static electricity generated on the first driving signal line from adversely affecting the display panel, in one embodiment, in the display panel according to the embodiment of the present disclosure, as shown in FIG. 6, the first subarea A11 may further include at least two fourth electrostatic discharge circuits ESD_4 at the edge of the first subarea A11 close to the middle area A10. Each of the fourth electrostatic discharge circuits ESD_4 is electrically connected to at least one first driving signal line L_1 to discharge static electricity for the first driving signal line L_1.

Alternatively, in order to prevent the static electricity generated on the second driving signal line L_2 from adversely affecting the display panel, in one embodiment, in the display panel according to the embodiment of the present disclosure, as shown in FIG. 6, the second subarea A12 may further include at least two fifth electrostatic discharge circuits ESD_5 located at the edge, closet to the middle area A10, of the second subarea A12. And each of the fifth electrostatic discharge circuits ESD_5 is electrically connected to at least one second driving signal line L_2 to discharge static electricity for the second driving signal line L_2. Certainly, in order to prevent the static electricity simultaneously generated on the first driving signal lines and the second driving signal lines from adversely affecting the display panel, in one embodiment, in the display panel according to the embodiment of the present disclosure, as shown in FIG. 6, the first subarea A11 may further include at least two fourth electrostatic discharge circuits ESD_4 located at the edge, close to the middle area A10, of the first subarea A11, and each of the fourth electrostatic discharge circuits ESD_4 is electrically connected to at least one first driving signal line L_1. And the second subarea A12 may further include at least two fifth electrostatic discharge circuits ESD_5 located at the edge, close to the middle area A10, of the second subarea A12, and each of the fifth electrostatic discharge circuits ESD_5 is electrically connected to at least one second driving signal line L_2.

An organic light-emitting diodes (OLEDs) display panel may have certain advantages of a low operating voltage, a fast response speed, a high luminous efficiency, a wide viewing angle and a wide operating temperature range, which are advantageous for a display device which is thin and has a light weight, low power consumption and a curved surface design. In the OLED display panel, a pixel compensation circuit is usually used to drive an OLED to emit light. The pixel compensation circuit is generally provided with a driving transistor for generating an operating current for driving the OLED to emit light, a storage capacitor for stabilizing a gate voltage of a driving transistor, a scan control transistor for controlling data signal input, and a light emitting control transistor for controlling the OLED to emit light. In the display panel, a gate scan signal is generally transmitted to the scan control transistor by using a gate line to drive the scan control transistor to input a data signal, and a light emitting control signal is generally transmitted to the light emitting control transistor by using a light emitting control signal line to drive the light emitting control transistor to control the OLED to emit light. In one embodiment, the display panel according to the embodiment of the present disclosure may be an organic light-emitting display panel.

Figure 7:
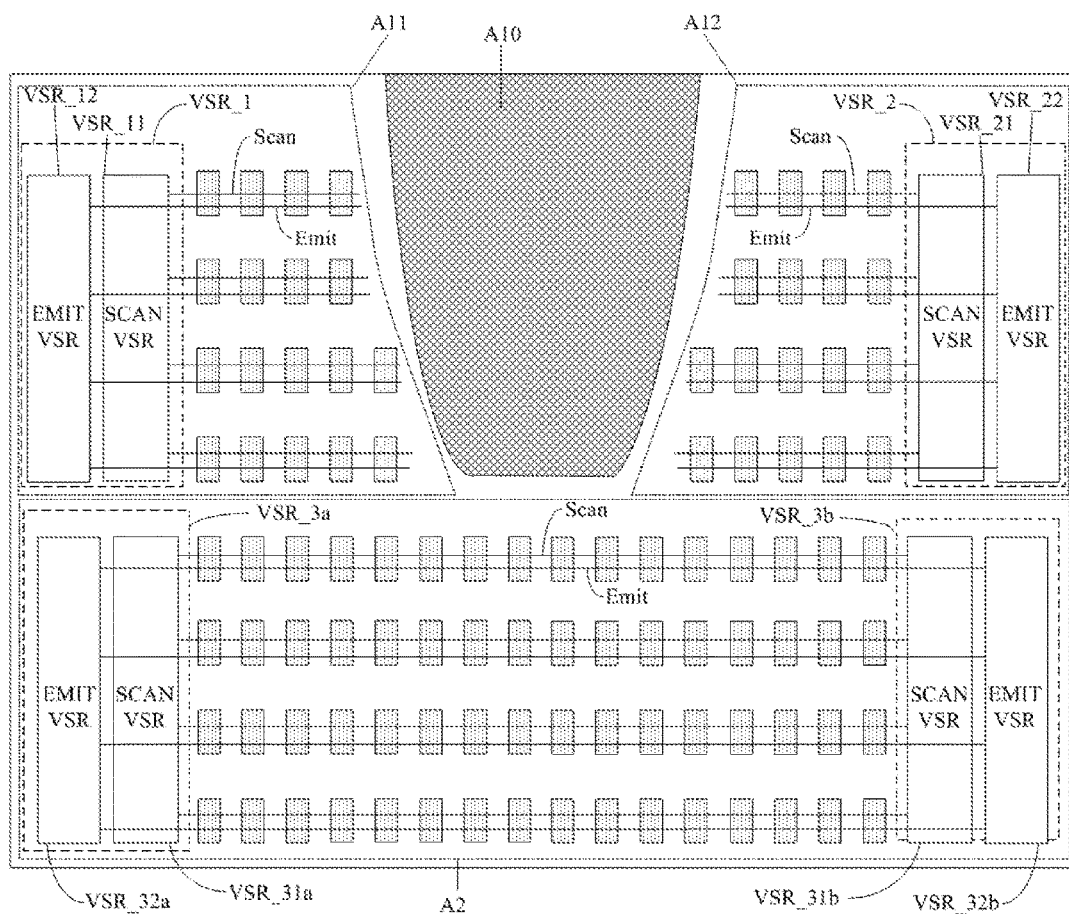
FIG. 7 is another structural schematic diagram of a display panel according to an embodiment of the present disclosure.

In one embodiment, in the display panel according to the embodiment of the present disclosure, as shown in FIG. 3 and FIG. 7, a first driving signal line L_1 and a second driving signal lines L_2 may each include a gate line Scan, the first driving circuit VSR_1 may include a first gate driving circuit VSR_11, and the second driving circuit VSR_2 may include a second gate driving circuit VSR_21. The first gate driving circuit VSR_11 is electrically connected to the gate lines Scan in the first subarea A11 and the second gate driving circuit VSR_12 is electrically connected to the gate lines Scan in the second subarea A12. The first gate driving circuit VSR_11 is configured to provide a gate scan signal for a scan control transistor to drive the scan control transistor electrically connected to a gate line Scan in the first subarea A11. The second gate driving circuit VSR_11 is configured to provide a gate scan signal for a scan control transistor to drive the scan control transistor electrically connected to a gate line Scan in the second subarea A12.

Alternatively, in one embodiment, as shown in FIG. 3 and FIG. 7, a first driving signal line L_1 and a second driving signal line L_2 may each include a light emitting control signal line Emit, and the first driving circuit VSR_1 may include a first light emitting driving circuit VSR_12, and the second driving circuit VSR_2 may include a second light emitting driving circuit VSR_22. The first light emitting driving circuit VSR_12 is electrically connected to a light emitting control signal line Emit in the first subarea A11 and the second light emitting driving circuit VSR_22 is electrically connected to a light emitting control signal line Emit in the second subarea A12. The first light emitting driving circuit VSR_12 is configured to provide a light emitting control signal for a light emitting control transistor to drive the light emitting control transistor electrically connected to a light emitting control signal line Emit in the first subarea A11. The second light emitting driving circuit VSR_22 is configured to provide a light emitting control signal for a light emitting control transistor to drive the light emitting control transistor electrically connected to a light emitting control signal line Emit in the second subarea A12.

Of course, in one embodiment, in the display panel according to the embodiment of the present disclosure, as shown in FIG. 3 and FIG. 7, a first driving signal line L_1 and a second driving signal line L_2 may also each include a gate line Scan and a light emitting control signal line Emit. The first driving circuit VSR_1 may include a first gate driving circuit VSR_11 and a first light emitting driving circuit VSR_12, where the first gate driving circuit VSR_1 is electrically connected to a gate line Scan in the first subarea A11, and the first light emitting driving circuit VSR_12 is electrically connected to a light emitting control signal line Emit in the first subarea A11. The second driving circuit VSR_2 may include a second gate driving circuit VSR_21 and a second light emitting driving circuit VSR_22, where the second gate driving circuit VSR_21 is electrically connected to a gate line Scan in the second subarea A12, and the second light emitting driving circuit VSR_22 is electrically connected to a light emitting control signal line Emit in the second subarea A12.

Figure 8A:
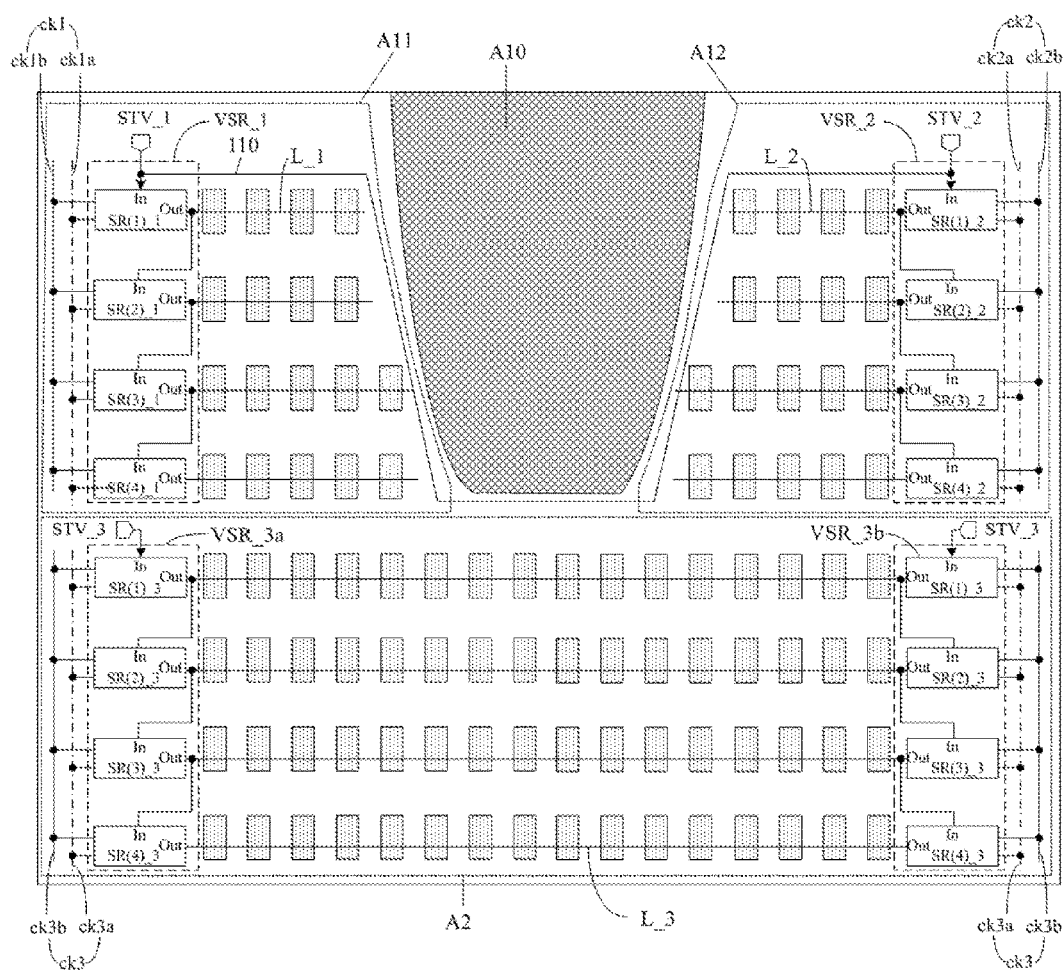
FIG. 8A is another structural schematic diagram of the display panel according to an embodiment of the present disclosure.
Figure 8B:
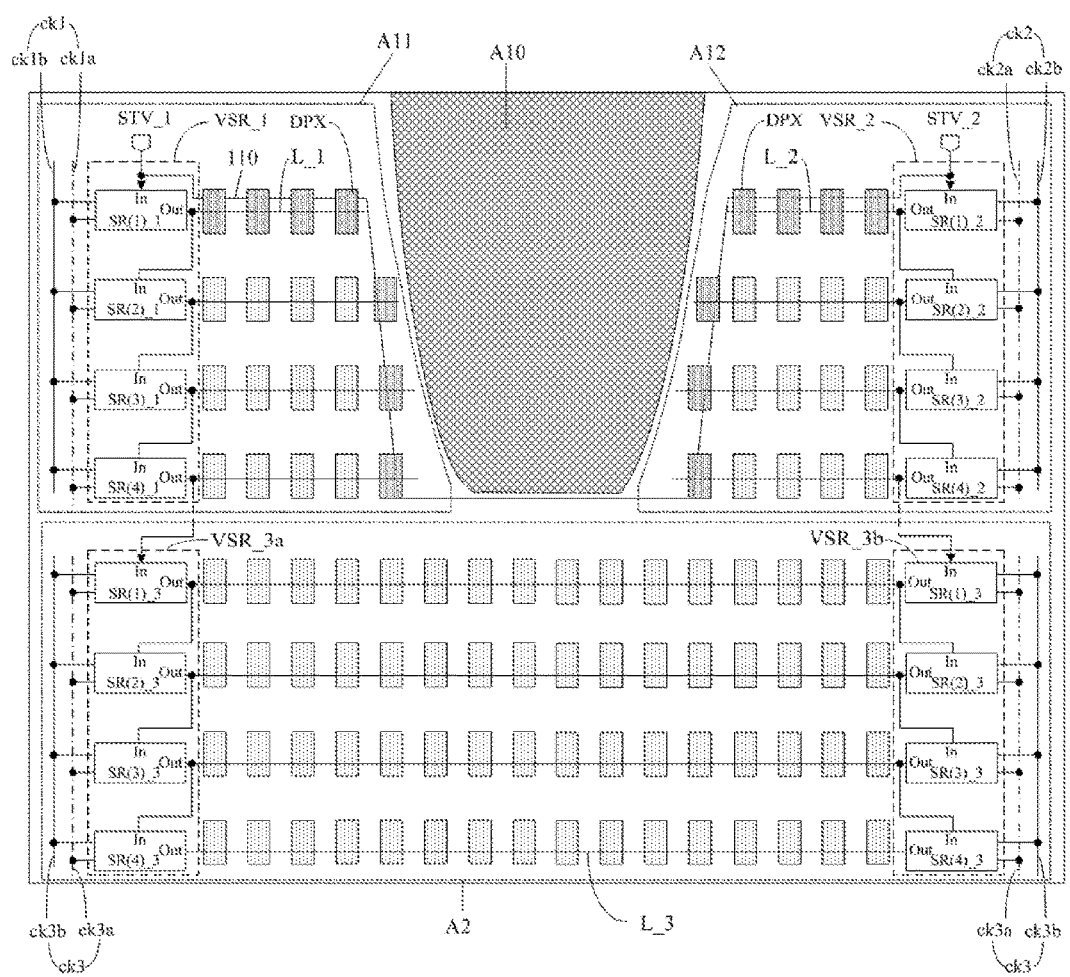
FIG. 8B is another structural schematic diagram of a display panel according to an embodiment of the present disclosure.
Figure 9A:
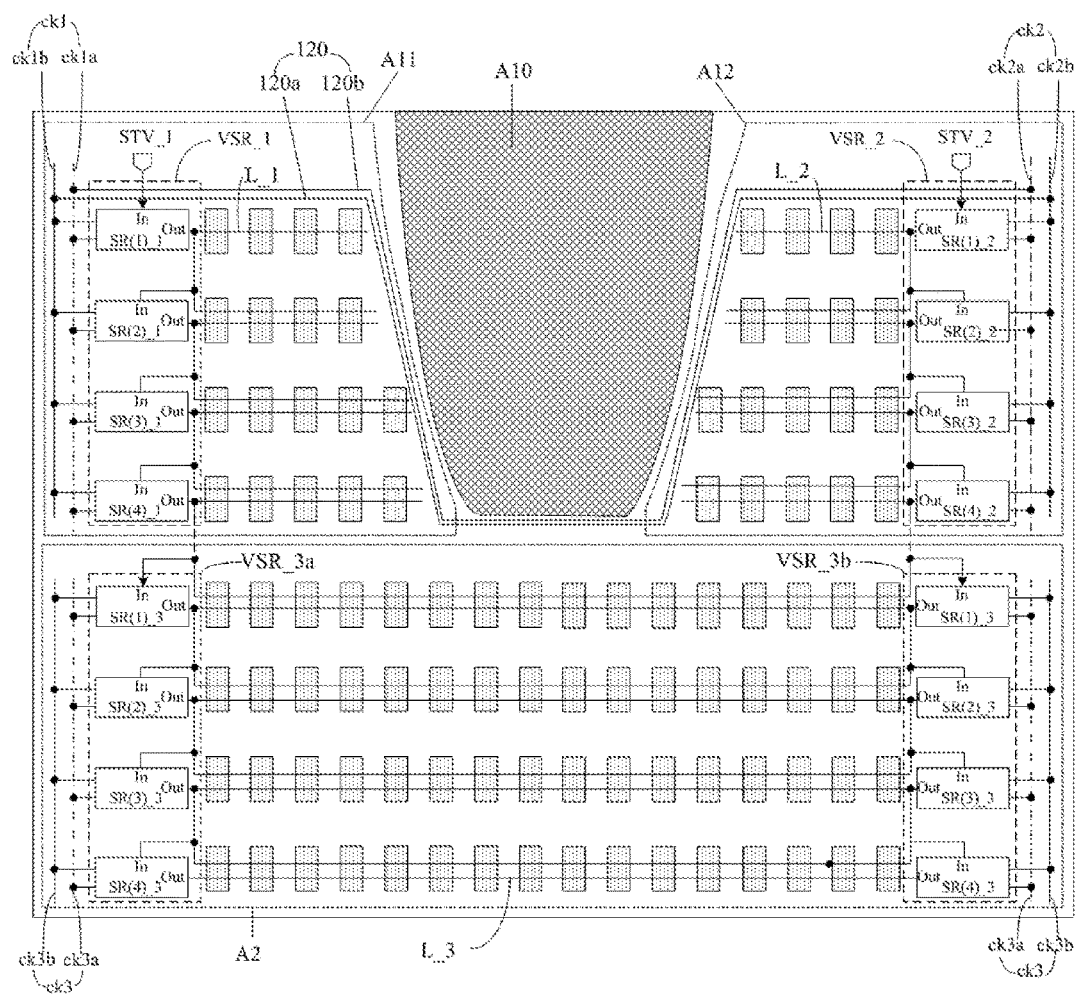
FIG. 9A is another structural schematic diagram of the display panel according to an embodiment of the present disclosure.
Figure 9B:
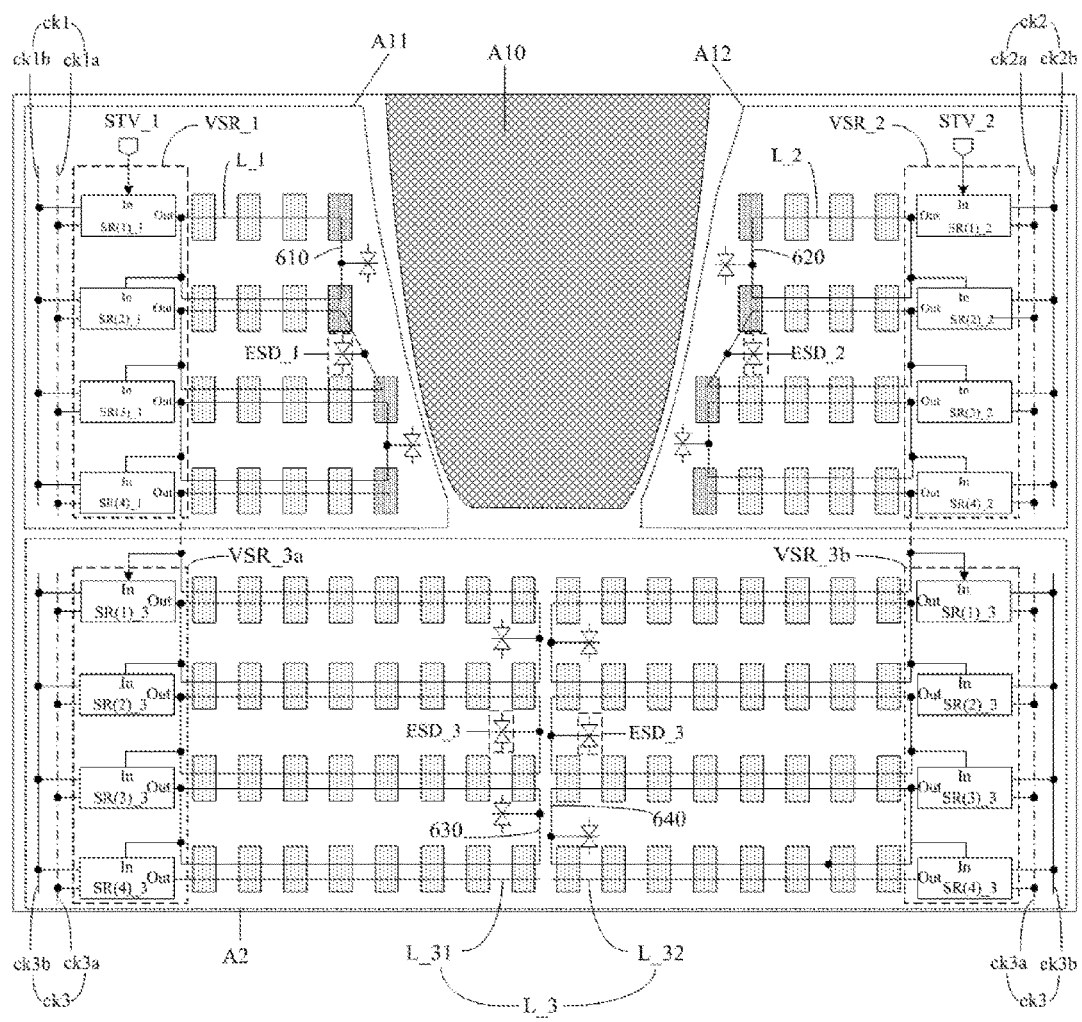
FIG. 9B is another structural schematic diagram of a display panel according to an embodiment of the present disclosure.

In one embodiment, in the display panel according to the embodiment of the present disclosure, as shown in FIG. 8A to FIG. 9B, the first driving circuit VSR_1 may include at least two cascaded first shift register units SR (n)_1 (n=1, 2, 3, . . . N, where N is the total number of the first shift register units cascaded in the first driving circuit, and each of FIG. 8A-FIG. 9B shows an example in which the total number of the first shift register units is 4). Each of the first shift register units SR (n)_1 is respectively electrically connected with a first clock signal line ck1, a first reference voltage signal line (not shown in FIG. 8A-FIG. 9B) and at least one first driving signal line L_1 correspondingly (each of FIGS. 8A and 8B shows an example of corresponding electric connection with one first driving signal line; each of FIGS. 9A and 9B shows an example of corresponding electric connection with two first driving signal lines). An input signal terminal In of the first-stage first shift register unit SR (1)_1 is connected to a first initial signal terminal STV_1, and the input signal terminals In of other stages of first shift register units SR(n)_1 are connected to driving signal output terminals Out_n−1 of their adjacent previous stages of first shift register units SR (n−1)_1. And the second driving circuit VSR_2 may include at least two cascaded second shift register units SR (n)_2. Each of the second shift register units SR (n)_2 is respectively electrically connected with a second clock signal line ck2, a second reference voltage signal line (not shown in FIG. 8A-FIG. 9B) and at least one second driving signal line L_2 correspondingly (each of FIGS. 8A and 8B shows an example of corresponding electric connection with one second driving signal line; each of FIGS. 9A and 9B shows an example of corresponding electric connection with two second driving signal lines). And an input signal terminal In of the first-stage second shift register unit SR (1)_2 is connected to a second initial signal terminal STV_2, and the input signal terminals In of other stages of second shift register units SR(n)_2 are respectively connected to driving signal output terminals Out_n−1 of their adjacent previous stages of second shift register units SR (n−1)_2.

In one embodiment, in the display panel according to the embodiment of the present disclosure, as shown in FIG. 7 to FIG. 9B, when the first driving circuit VSR_1 includes a first gate driving circuit VSR_11, the first gate driving circuit VSR_11 may include cascaded first shift register units VSR_(n)_1. When the second driving circuit VSR_2 includes a second gate driving circuit VSR_21, the second gate driving circuit VSR_21 may include cascaded second shift register units VSR_(n)_2.

In one embodiment, in the display panel according to the embodiment of the present disclosure, as shown in FIG. 7 and FIG. 8A to FIG. 9B, when the first driving circuit VSR_1 includes a first light emitting driving circuit VSR_12, the first light emitting driving circuit VSR_12 may include cascaded first shift register units VSR (n)_1. When the second driving circuit VSR_2 includes a second light emitting driving circuit VSR_22, the second light emitting driving circuit VSR_22 may include cascaded second shift register units VSR (n)_2.

In one embodiment, in the display panel according to the embodiment of the present disclosure, as shown in FIG. 8A to FIG. 9B, all the first shift register units SR (n)_1 are located on the same side of the first subarea A11; and all the second shift register units SR (n)_2 are located on the same side of the second subarea A12. In this way, the first shift register units SR (n)_1 are only arranged on one side of the first subarea A11 and the second shift register units SR (n)_2 are only arranged on one side of the second subarea A12, so that a border is only arranged on one side of each of the first subarea A11 and the second subarea A12 and therefore the border of the display panel is lowered. In addition, arranging these shift register units on one side also facilitates the wiring of the signal lines and simplifies the manufacturing process.

In order to reduce the size of the non-display areas between the first subarea and the middle area and between the second subarea and the middle area, in one embodiment, in the display panel according to the embodiment of the present disclosure, as shown in FIG. 8A to FIG. 9B, all the first shift register units SR (n)_1 are located at a side, away from the middle area A10, of the first subarea A11, and all the second shift register units SR (n)_2 are located at a side, away from the middle area A10, of the second subarea A12. In this way, the size of the non-display areas between the first subarea A11 and the middle area A10 and between the second subarea A12 and the middle area A10 can be reduced, which may be beneficial for the narrow bezel design. Moreover, arranging the shift register units on both sides of the display panel also facilitates the wiring of the signal lines and simplifies the preparation process.

Figure 10:
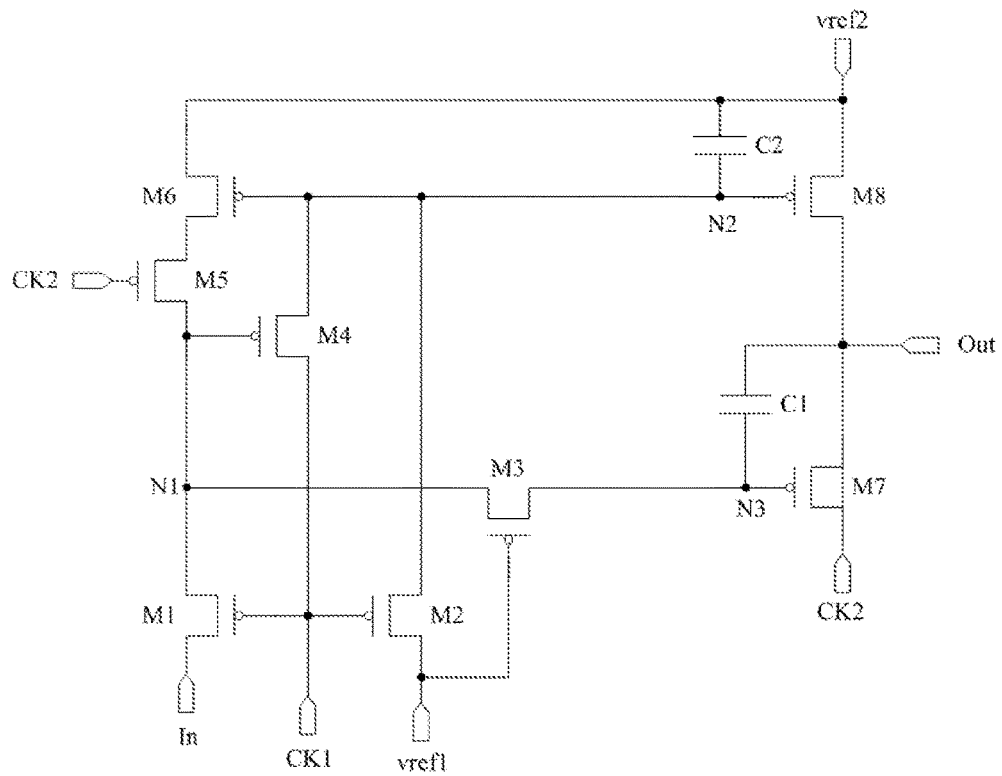
FIG. 10 is a schematic diagram of a structure of a first shift register unit according to an embodiment of the present disclosure.

In one embodiment, in the display panel according to the embodiment of the present disclosure, as shown in FIG. 10, a first shift register unit may include a first switching transistor M1, a second switching transistor M2, a third switching transistor M3, a fourth switching transistor M4, a fifth switching transistor M5, a sixth switching transistor M6, a seventh switching transistor M7, an eighth switching transistor M8, a first capacitor C1, and a second capacitor C2. A control terminal of the first switching transistor M1 is connected to a first clock signal terminal CK1, a first terminal of the first switching transistor M1 is connected to an input signal terminal In and a second terminal of the first switching transistor M1 is connected to a first node N1. A control terminal of the second switching transistor M2 is connected to the first clock signal terminal CK1, a first terminal of the second switching transistor M2 is connected to a first reference voltage signal terminal vref1, a second terminal of the second switching transistor M2 is connected to a second node N2. A control terminal of the third switching transistor M3 is connected to the first reference voltage signal terminal vref1, a first terminal of the third switching transistor M3 is connected to the first node N1, and a second terminal of the third switching transistor M3 is connected to a third node N3. A control terminal of the fourth switching transistor M4 is connected to the first node N1, a first terminal of the fourth switching transistor M4 is connected to the first clock signal terminal CK1, and a second terminal of the fourth switching transistor M4 is connected to the second node N2.

A control terminal of the fifth switching transistor M5 is connected to a second clock signal terminal CK2, a first terminal of the fifth switching transistor M5 is connected to a second terminal of the sixth switching transistor M6, and a second terminal of the fifth switching transistor M5 is connected to the first Node N1. A control terminal of the sixth switching transistor M6 is connected to the second node N2, and a first terminal of the sixth switching transistor M6 is connected to a second reference voltage signal terminal vref2. A control terminal of the seventh switching transistor M7 is connected to the third node N3, a first terminal of the seventh switching transistor M7 is connected to the second clock signal terminal CK2, and a second terminal of the seventh switching transistor M7 is connected to a driving signal output terminal Out of the first shift register unit. A control terminal of the eighth switching transistor M8 is connected to the second node N2, a first terminal of the eighth switching transistor M8 is connected to the second reference voltage signal terminal vref2, and a second terminal of the eighth switching transistor M8 is connected to the driving signal output terminal Out of the first shift register unit. A first terminal of the first capacitor C1 is connected to the third node N3, and a second terminal of the first capacitor C1 is connected to the driving signal output terminal Out of the first shift register unit. A first terminal of the second capacitor C2 is connected to the second node N2, and a second terminal of the second capacitor C2 is connected to the second reference voltage terminal vref2.

In one embodiment, in the display panel according to the embodiment of the present disclosure, the above-mentioned switching transistors may be P-type transistors, or the above-mentioned switching transistors may be N-type transistors, which is not limited herein. Furthermore, the control terminals of the above-mentioned switching transistors are their gates. According to a type of a switching transistor, its first terminal can be its source and its second terminal can be its drain, or its first terminal can be its drain and its second terminal can be its source, which will not be limited herein.

The above is only an example to illustrate a structure of a first shift register unit according to the embodiment of the present disclosure. In one embodiment, the structure of the first shift register units is not limited to the above structure according to the embodiment of the present disclosure and may also be other structures known to those skilled in the art, which will not be limited herein.

When the structure of a first shift register unit is as shown in FIG. 10, with reference to FIGS. 8A-10, the first clock signal line ck1 electrically connected to the first driving circuit VSR_1 may include two clock sub-signal lines which are a first clock sub-signal line ck1a and a second clock sub-signal line ck1b, respectively. Clock signals transmitted on the two clock sub-signal lines have a same in cycle and a same duty cycle. The first clock signal terminal CK1 of the (2k−1)-th-stage first shift register unit SR (2k−1)_1 and the second clock signal terminal CK2 of the 2k-th-stage first shift register unit SR (2k)_1 are both electrically connected to a same clock sub-signal line, that is, they are both electrically connected to the first clock sub-signal line ck1a. The second clock signal terminal CK2 of the (2k−1)-th first shift register unit SR (2k−1)_1 and the first clock signal terminal CK1 of the 2k-th first shift register unit SR (2k)_1 Are electrically connected to a same clock sub-signal line, that is, they are electrically connected to the second clock sub-signal line ck1$b$, where k is a positive integer.

In addition, when the structure of a first shift register unit is as shown in FIG. 10, a first reference voltage signal line may include two reference voltage sub-signal lines, and the two reference voltage sub-signal lines are respectively a first reference voltage sub-signal line and a second reference voltage sub-signal line. In one embodiment, the first reference voltage signal terminal vref1 of each stage of first shift register units may be electrically connected to the first reference voltage sub-signal line, and the second reference voltage signal terminal vref2 of each stage of first shift register units may be electrically connected to the second reference voltage sub-signal line. In a practical application, one of the first reference voltage sub-signal line and the second reference voltage sub-signal line is used to transmit a high-voltage reference signal and the other reference voltage sub-signal line is used to transmit a low-voltage reference signal.

For the purpose of a unified manufacturing process, in one embodiment, in the display panel according to the embodiment of the present disclosure, the structure of a second shift register units may be the same as the structure of a first shift register unit. Of course, the structure of a second shift register unit may also be different from the structure of a first shift register unit. In a practical application, the structures of a first shift register unit and a second shift register unit need to be determined according to an actual application environment, which is not limited herein.

In one embodiment, when the structure of a second shift register unit is the same as the structure of a first shift register unit, in the display panel according to the embodiment of the present disclosure, the structure of the second shift register unit may be as shown in FIG. 10. With reference to FIGS. 8A-10, the second clock signal line ck2 electrically connected to the second driving circuit VSR_2 may include two clock sub-signal lines which are a third clock sub-signal line ck2$a$ and a fourth clock sub-signal line ck2$b$, respectively, and clock signals transmitted on the two clock sub-signal lines are the same in cycle and in duty cycle. The first clock signal terminal CK1 of the (2k−1)-th-stage second shift register unit SR (2k−1)_1 and the second clock signal terminal CK2 of the 2k-th-stage second shift register unit SR (2k)_1 are both electrically connected to the same clock sub-signal line, that is, they are both electrically connected to the third clock sub-signal line ck2$a$. The second clock signal terminal CK2 of the (2k−1)-th-stage second shift register unit SR (2k−1)_1 and the first clock signal terminal CK1 of the 2k-th-stage second shift register unit SR (2k)_1 are both electrically connected to the same clock sub-signal line, that is, they are both electrically connected to the fourth clock sub-signal line ck2$b$.

Furthermore, each second reference voltage signal line may include two reference voltage sub-signal lines, and the two reference voltage sub-signal lines are a third reference voltage sub-signal line and a fourth reference voltage sub-signal line, respectively. In one embodiment, the first reference voltage signal terminal vref1 of each stage of second shift register units may be electrically connected to the third reference voltage sub-signal line, and the second reference voltage signal terminal vref2 of each stage of the second shift register units may be electrically connected to the fourth reference voltage sub-signal line. In a practical application, one of the third reference voltage sub-signal line and the fourth reference voltage sub-signal line is used to transmit a high-voltage reference signal and the other reference voltage sub-signal line is used to transmit a low-voltage reference signal.

Since the first subarea and the second subarea are separated by the middle area, in order to avoid display non-uniformity caused when pixels of the first subarea and the second subarea are driven at different time, in one embodiment, in the display panel according to the embodiment of the present disclosure, as shown in FIG. 8A to FIG. 9B, the first shift register units SR (n)_1 located in the first subarea A11 correspond to the second shift register units SR (n)_2 located in the second subarea A12 in a one to one relationship and a first shift register unit SR (n)_1 and a second shift register unit SR (n)_2 which are correspondingly arranged simultaneously output the same driving signal. The structures of the first shift register units and the second shift register units are the same, and the first shift register units and the second shift register units are the same type of shift register units so that the first driving circuit drives the first driving signal lines to operate in the same way as the second driving circuit drives the second driving signal lines to operate and therefore a first and a second shift register units which are arranged correspondingly can simultaneously output the same driving signal to simultaneously drive the corresponding first and second driving signal lines.

In one embodiment, as shown in FIG. 7 to FIG. 9B, when the first driving circuit VSR_1 includes a first gate driving circuit VSR_11 and the second driving circuit VSR_2 includes a second gate driving circuit VSR_21, the structure of each of the first shift register units in the first gate driving circuit VSR_1 is the same as the structure of each of the second shift register units in the second gate driving circuit VSR_21. Moreover, the first-stage first shift register unit SR (1)_1 is arranged corresponding to the first-stage second shift register unit SR (1)_2, and the second-stage first shift register unit SR (2)-1 is arranged corresponding to the second-stage second shift register unit SR (2)_2, the third-stage first shift register unit SR (3)_1 is arranged corresponding to the third-stage second shift register unit SR (3)_2, and so on, and the same arrangement pattern will not be described in detail here. So that a first shift register unit SR (n)_1 and a second shift register unit SR (n)_2, which correspond to each other, output the same gate scan signal at the same time.

In one embodiment, as shown in FIG. 7 to FIG. 9B, when the first driving circuit VSR_1 includes a first light emitting driving circuit VSR_12 and the second driving circuit VSR_2 includes a second light emitting driving circuit VSR_21, the structure of each of first shift register units in the first light emitting driving circuit VSR_12 is the same as the structure of each of the second shift register units in the second light-emitting driving circuit VSR_22. Moreover, the first-stage first shift register unit SR (1)_1 is arranged corresponding to the first-stage second shift register unit SR (1)_2, and the second-stage first shift register unit SR (2)-1 is arranged corresponding to the second-stage second shift register unit SR (2)_2, the third-stage first shift register unit SR (3)_1 is arranged corresponding to the third-stage second shift register unit SR (3)_2, and so on, and the same arrangement pattern will not be described in detail here. So that a first shift register unit SR (n)_1 and a second shift register unit SR (n)_2, which correspond to each other, output the same light emitting control signal at the same time.

When a first shift register unit and a second shift register unit which are arranged correspondingly output the same driving signal at the same time, in order to prevent the problem that the first shift register unit and the second shift register unit which are arranged correspondingly output different signals because initial signals input in a same type of driving circuits in the first driving circuit and in the second driving circuit are different, in one embodiment, the first shift register unit and the second shift register unit are the same in structure and are the same type of shift register units. In the display panel according to the embodiment of the present disclosure, as shown in FIG. 8A, the display panel further includes a first wire 110, and the first initial signal terminal STV_1 and the second initial signal terminal STV_2 are electrically connected to each other through the first wire 110. In one embodiment, when the first driving circuit only includes a first gate driving circuit and the second driving circuit only includes a second gate driving circuit, the display panel may include a first wire for allowing a first initial signal terminal corresponding to the first gate driving circuit and a second initial signal terminal corresponding to the second gate driving circuit to be electrically connected with each other. When the first driving circuit only includes a first light emitting driving circuit and the second driving circuit only includes a second light emitting driving circuit, the display panel may include a first wire for allowing a first initial signal terminal corresponding to the first light emitting driving circuit and a second initial signal terminal corresponding to the second light emitting driving circuit to be electrically connected with each other. When the first driving circuit includes the first gate driving circuit and the first light emitting driving circuit and the second driving circuit includes the second gate driving circuit and the second light emitting driving circuit, the display panel may include two first wires, and a first initial signal terminal electrically connected to the first gate driving circuit and a second initial signal terminal electrically connected to the second gate driving circuit are electrically connected with each other through one of the first wires. Moreover, the first initial signal terminal electrically connected to the first light emitting driving circuit and the second initial signal terminal electrically connected to the second light emitting driving circuit are electrically connected with each other through the other first wire.

In order to avoid the difference between the clock signal and the reference signal, in one embodiment, a first shift register unit and a second shift register unit are the same in structure and are the same type of shift register units. In the display panel according to the embodiment of the present disclosure, as shown in FIG. 9A, the display panel may further include at least two second wires 120 and at least two third wires, the second wires 120 and the third wires are mutually insulated from the first wires and the second wires 120 and the third wires are insulated from each other. The clock control signal lines with the same period and the same phase in the first clock control signal line ck1 and the second clock control signal line ck2 are electrically connected to each other through one second wire. In this way, clock signals input by an external circuit into the clock control signal lines which need the same period and the same phase in the first clock control signal line and in the second clock control signal line can be made the same in period and phase. In one embodiment, when the first shift register units and the second shift register units adopt the structure shown in FIG. 9, when clock signals transmitted by the first clock sub-signal line ck1a and the third clock sub-signal line ck2a are the same in period and phase, a second wire 120a may be used to electrically connect the first clock sub-signal line ck1a and the third clock sub-signal line ck2a as one clock sub-signal line. Similarly, the second clock sub-signal line ck1b and the fourth clock sub-signal line ck2b are electrically connected to each other as a clock sub-signal line by using another second wire 120b.

In one embodiment, in the display panel according to the embodiment of the present disclosure, the reference voltage signal lines of the same voltage in the first reference voltage signal lines and the second reference voltage signal lines are electrically connected to each other through a third wire. In this way, signals input by the external circuit into the reference voltage signal lines of the same voltage in the first reference voltage signal lines and the second reference voltage signal lines are completely the same. In addition, it is also possible to reduce connection wires between the external circuit and the reference voltage signal lines to further narrow the bezel.

In one embodiment, generally, the first initial signal terminal and the second initial signal terminal are respectively disposed at a short distance from the first-stage first shift register unit and the first-stage second shift register unit. Therefore, in order to reduce the resistance of the first wire, in the display panel according to the embodiment of the present disclosure, as shown in FIG. 8A to FIG. 9A, the first wires 110, the second wires 120, and the third wires may be arranged along the edge, close to the middle area A10, of the first subarea A11, the edge, close to the middle area A10, of the second subarea A12, and the edge, close to the middle area A10, of the second area A2.

In one embodiment, in the display panel according to the embodiment of the present disclosure, the first shift register unit and the second shift register unit each include at least two switching transistors located on the substrate, as shown in FIGS. 11A-11D (FIGS. 11A-11D both illustrate one switching transistor in a first shift register unit as an example), each first shift register unit includes a switching transistor 200 on the substrate 100. Furthermore, each of the pixels PX may include a light-emitting element 300 on the substrate 100 and a pixel compensation circuit electrically connected to the light-emitting element 300 (FIG. 11A to FIG. 11D both illustrate a driving transistor and a storage capacitor in the pixel compensation circuit as an example). The light-emitting element 300 includes an anode 310, an electroluminescent layer 320 and a cathode 330 that are stacked one above another. The pixel compensation circuit at least includes a storage capacitor and a driving transistor 400 electrically connected to the storage capacitor. Each switching transistor 200 may include a gate 210, an active layer 220 insulated from the gate 210, a source 231 and a drain 232 both insulated from the gate 210 and electrically connected to the active layer 220. The driving transistor 400 includes a gate 410, an active layer 420 insulated from the gate 410, a source 431 and a drain 432 both insulated from the gate terminal 410 and electrically connected to the active layer 420. The gate 210, the active layer 220, the source 231 and the drain 232 of a switching transistor 200 are respectively disposed at the same layer as the gate 410, the active layer 420, the source 431 and the drain 432 of the driving transistor 400. In a practical application, the switching transistors in the second shift register units are configured in the same way as the switching transistors in the first shift register units, and details are not described herein again. Furthermore, a metal terminal 500 insulated from both of the source 431 and the drain 432 of each driving transistor 400 is further disposed between the layer where the source 431 and the drain 432 of the driving transistor 400 are located and the layer where the gate 410 is located, and the orthographic projection of the metal terminal 500 on the substrate 100 and the orthographic projection of the gate 410 on the substrate 100 have an overlap area that forms a storage capacitance. The metal terminal 500 may serve as a first terminal of the storage capacitor, and the gate 410 in the overlap area may serve as a second terminal of the storage capacitor. In a practical application, the drains 431 of the driving transistors and the anodes 310 are electrically connected via holes to provide a voltage for the anode 310, so that the anode 310 injects holes into the electroluminescent layer 320. Meanwhile, a voltage is applied to the cathode 330 so that the cathode 330 injects electrons into the electroluminescent layer 320 and thus holes and electrons are combined in the electroluminescent layer 320 to emit light to achieve the displaying function of the display panel.

In one embodiment, when the display panel includes gate lines, the gate lines are generally arranged at the same layer as the gates of the switching transistors. When the display panel includes light emitting control signal lines, the light emitting control signal lines are also generally arranged at the same layer as the gates of the switching transistors. Furthermore, in a practical application, the display panel further includes data lines extending along the column direction of the pixels and configured to transmit data signals to the pixels, and the data lines are generally arranged at the same layer as the sources and the drains of the switching transistors.

Figure 11A:
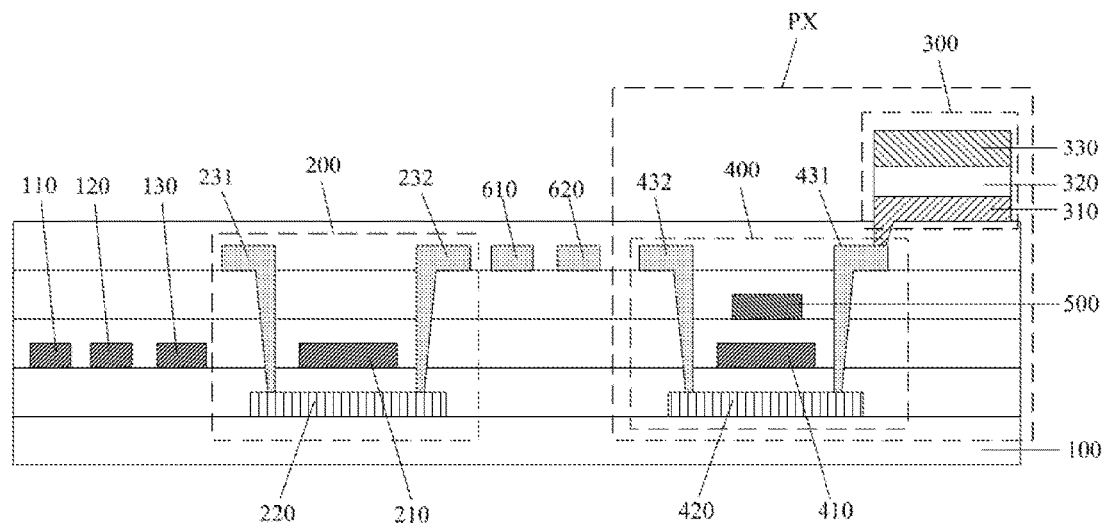
FIG. 11A is a schematic diagram of a partial structure of a display panel according to an embodiment of the present disclosure.

In one embodiment, in the display panel according to the embodiment of the present disclosure, as shown in FIG. 11A, at least one kind of the first wires 110, the second wires 120 and the third wires 130 may be made of the same material and configured at the same layer as the gates 210 of the switching transistors 200. In this way, when the switching transistors 200 are manufactured, it is only required to change the previous pattern during the formation of the gates 210 of the switching transistors 200, and then the patterns of the gates 210 of the switching transistors 200 and at least one kind of the first wires 110, the second wires 120 and the third wires 130 can be formed by performing a patterning process once, without need of an additional manufacturing process of at least one kind of the first wires 110, the second wires 120 and the third wires 130, thus simplifying the preparation process, saving production cost, and improving the production efficiency. In one embodiment, as shown in FIG. 11A, the first wires 110 and the gates 210 of the switching transistors 200 may be made of the same material and configured at the same layer. Alternatively, as shown in FIG. 11A, the second wires 120 may be formed of the same material and configured at the same layer as the gates 210 of the switching transistors 200. Alternatively, as shown in FIG. 11A, the third wires 130 may be formed of the same material and configured at the same layer as the gates 210 of the switching transistors 200. Alternatively, as shown in FIG. 11A, the first wires 120, the second wires 130 and the third wires 140 may all be made of the same material and configured at the same layer as the gates of the switching transistors 200. In a practical application, wires made of the same material and configured at the same layer as the gates of the switching transistors need to be designed and determined according to the actual application environment, which is not limited herein. Furthermore, the wires made of the same material and configured at the same layer as the gates are also insulated from the gate lines and the light emitting control signal lines.

Figure 11B:
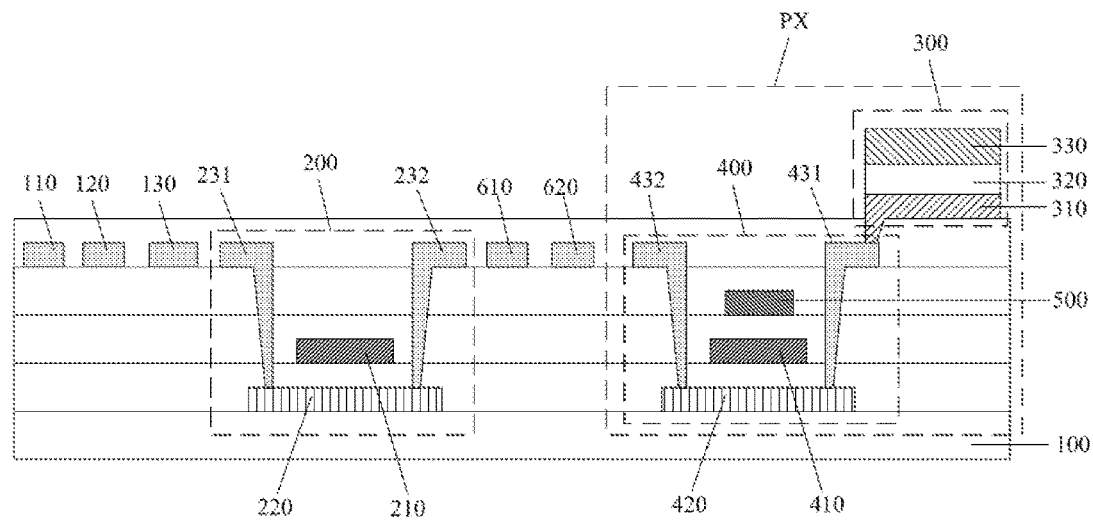
FIG. 11B is another schematic diagram of a partial structure of a display panel according to an embodiment of the present disclosure.

In one embodiment, in the display panel according to the embodiment of the present disclosure, as shown in FIG. 11B, at least one kind of the first wires 110, the second wires 120, and the third wires 130 may also be made of the same material and configured at the same layer as the sources 231 and the drains 232 of the switching transistors 200. In this way, when the switching transistors 200 are manufactured, it is only required to change the previous pattern during the formation of the sources 231 and the drains 232 of the switching transistors 200, and then the patterns of the sources 231 and the drains 232 of the switching transistors 200 and at least one kind of the first wires 110, the second wires 120 and the third wires 130 can be formed by performing a patterning process once, without need of an additional manufacturing process of at least one kind of the first wires 110, the second wires 120 and the third wires 130, thus simplifying the preparation process, saving production cost, and improving the production efficiency. In one embodiment, as shown in FIG. 11B, the first wire 110 may be made of the same material and configured at the same layer as the sources 231 and the drains 232 of the switching transistors 200. Alternatively, as shown in FIG. 11B, the second wires 120 may be made of the same material and configured at the same layer as the sources 231 and the drains 232 of the switching transistors 200. Alternatively, as shown in FIG. 11B, the third wires 130 may be made of the same material and configured at the same layer as the sources 231 and the drains 232 of the switching transistors 200. Alternatively, as shown in FIG. 11B, the first wire 110, the second wires 120 and the third wires 130 may all be made of the same material and configured at the same layer as the sources 231 and the drains 232 of the switching transistor 200. In a practical application, wires made of the same material and configured at the same layer as the sources and the drains of the switching transistors need to be designed and determined according to the actual application environment, which is not limited herein. Furthermore, the wires made of the same material and configured at the same layer as the sources and the drains are also insulated from the data lines. In a practical application, the sources 231 and the drains 232 of the switching transistors 200 each include composite films consisting of Mo, Al and Mo stacked one above another. Alternatively, the sources 231 and the drains 232 of the switching transistor 200 each may also include composite films consisting of Ti, Al, and Ti stacked one above another, which is not limited herein. Therefore, the resistance of the wires made of the same material and configured at the same layer as the sources and the drains can also be reduced.

Figure 11C:
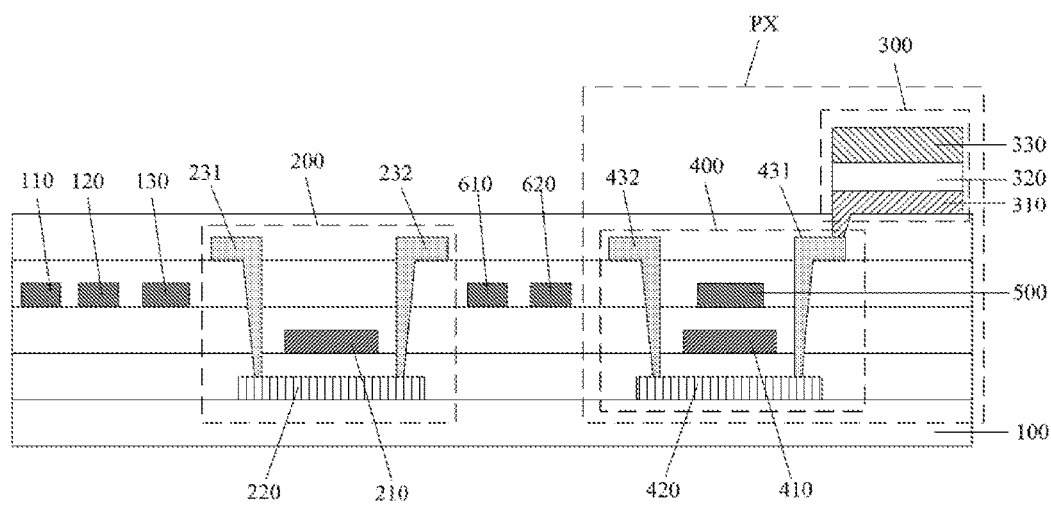
FIG. 11C is another schematic diagram of a partial structure of a display panel according to an embodiment of the present disclosure.

In one embodiment, in the display panel according to the embodiment of the present disclosure, as shown in FIG. 11C, at least one kind of the first wires 110, the second wires 120, and the third wires 130 may also be made of the same material and configured at the same layer as one terminal of the storage compactors. In this way, when one terminal of the storage compactor is manufactured, it is only required to change the previous pattern during the formation of one terminal of the storage compactors, and then the patterns of one terminal of the storage compactors and at least one kind of the first wires 110, the second wires 120 and the third wires 130 can be formed by performing a patterning process once, without need of an additional manufacturing process of at least one of the first wires 110, the second wires 120 and the third wires 130, thus simplifying the manufacturing process, saving production cost, and improving the production efficiency. In one embodiment, as shown in FIG. 11C, the first wire 110 may be made of the same material and configured at the same layer as one terminal, i.e., the metal terminal 500, of the storage compactors. In one embodiment, as shown in FIG. 11C, the second wires 120 may also be made of the same material and configured at the same layer as one terminal, i.e., the metal terminal 500, of the storage compactor. In one embodiment, as shown in FIG. 11C, the third wires 130 may also be made of the same material and configured at the same layer as one terminal, i.e., the metal terminal 500, of the storage compactors. In one embodiment, as shown in FIG. 11C, the first wire 110, the second wires 120 and the third wires 130 may all be made of the same material and configured at the same layer as one terminal, i.e., the metal terminal 500, of the storage compactor. In a practical application, wires made of the same material and configured at the same layer as one terminal of the storage compactors need to be designed and determined according to the actual application environment, which is not limited herein. Furthermore, the wires made of the same material and configured at the same layer as the metal terminal are also insulated from the metal terminal.

Figure 11D:
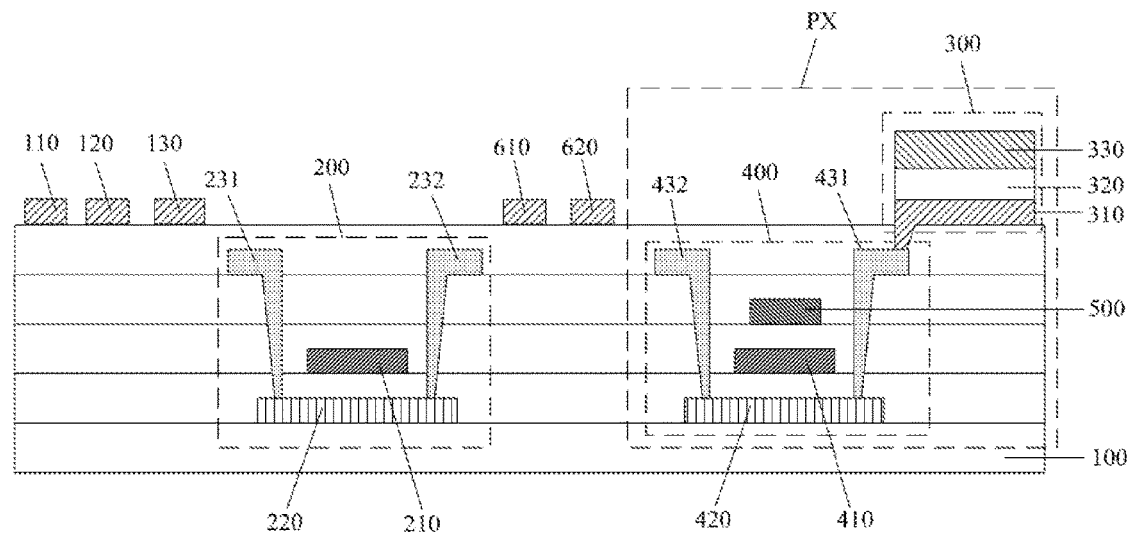
FIG. 11D is another schematic diagram of a partial structure of a display panel according to an embodiment of the present disclosure.

In one embodiment, in the display panel according to the embodiment of the present disclosure, as shown in FIG. 11D, at least one kind of the first wire 110, the second wires 120, and the third wires 130 may also be made of the same material and configured at the same layer as the anode 310. In this way, when the light-emitting element is manufactured, it is only required to change the previous pattern during the formation of the anode 310, and then the patterns of the anode 310 and at least one kind of the first wire 110, the second wires 120 and the third wires 130 can be formed by performing a manufacturing process once, without need of an additional manufacturing process of at least one of the first wire 110, the second wires 120 and the third wires 130, thus simplifying the manufacturing process, saving production cost, and improving the production efficiency. In one embodiment, as shown in FIG. 11D, the first wire 110 and the anode 310 may be made of the same material and configured at the same layer. Alternatively, as shown in FIG. 11D, the second wires 120 may be formed of the same material and configured at the same layer as the anode 310. Alternatively, as shown in FIG. 11D, the third wires 130 may be formed of the same material and configured at the same layer as the anode 310. Alternatively, as shown in FIG. 11D, the first wires 110, the second wires 120 and the third wires 130 may all be made of the same material and configured at the same layer as the anode 310. In a practical application, wires made of the same material and configured at the same layer as the anode need to be designed and determined according to the actual application environment, which is not limited herein. Furthermore, the wires made of the same material and configured at the same layer as the anode are also insulated from the anode.

In one embodiment, in the display panel according to the embodiment of the present disclosure, as shown in FIG. 8B (FIG. 8B illustrates the first wire as an example), non-display dummy pixels DPX may be further included at parts of edges of the first subarea A11 and the second subarea A12, where the part of the edge of the first subarea A11 is at least the edge, close to the middle area A10, of the first subarea A11 and the part of the edge of the second subarea A12 is at least the edge, close to the middle area A10, of the second subarea A12. The respective orthographic projections of the first wires 110, the second wires and the third wires on the display panel and the orthographic projection of the non-display dummy pixels DPX on the display panel overlap. Therefore, the first wires 110, the second wires and the third wires are arranged at the positions of the non-display dummy pixels in the first subarea and the second subarea without occupying the border area, thus further reducing the width of the border. In one embodiment, each of the non-display dummy pixels may include at least one of a light-emitting element and a pixel compensation circuit. When a non-display dummy pixel includes a light-emitting element and a pixel compensation circuit, the light-emitting element and the pixel compensation circuit in the non-display dummy pixels are the same in structure as the light-emitting elements and the pixel compensation circuits in the pixels for displaying, respectively, except that in the non-display dummy pixels, the light-emitting elements and the pixel compensation circuits are insulated from each other, that is, no electrical connection is formed, so that the non-display dummy pixels are not used for light-emitting displaying. Therefore, it is possible to use the anodes in the non-display dummy pixels overlapping the projection of the first wire, that is, the anodes arranged in the non-display dummy pixels may be electrically connected to form the first wire. Of course, it is also possible that the anodes are arranged in the non-display dummy pixels. In this case, the first wire may be arranged at the positions of the anodes in the non-display dummy pixels to simplify the structure of the display panel and avoid the short circuit caused by complicated wiring. Similarly, the second wires and the third wires are basically arranged in the same way as the first wire, which will not be repeated herein.

In one embodiment, in the display panel according to the embodiment of the present disclosure, as shown in FIG. 9B, the first subarea A11 may further include at least two first connecting lines 610 insulated from each other. In the first subarea A11, one end of each of at least two first driving signal lines L_1 is electrically connected to a same first shift register unit SR (n)_1, and the other ends of the at least two first driving signal lines L_1 are electrically connected with each other through one first connecting line 610. In this way, adverse influence on the displaying of the display panel, caused by floating of one end of a first driving signal line L_1 extending to the edge of the first subarea A11 close to the middle area A10, can be avoided. Moreover, during the manufacturing and the use of the display panel, especially when the substrate is flexible, the display panel may be bent more easily, which may result in open circuits between the first driving signal lines and the first shift register units, thereby causing that the first driving signal lines in the open circuits cannot transmit a driving signal normally. In the embodiment of the present disclosure, since the first driving signal lines electrically connected to the same first shift register unit are electrically connected through a first connecting line, when one of the first driving signal lines is disconnected from the first shift register unit, a driving signal is transmitted to the disconnected first driving signal line with the help from the first connecting line, so that normal driving of the display panel can be ensured to realize the normal light-emitting displaying of the display panel.

In one embodiment, when a first driving signal line includes a gate line, one end of each of at least two gate lines are electrically connected to a same first shift register unit, and the other end of each of the at least two gate lines are electrically connected via one first connecting line. When a first driving signal line includes a light emitting control signal line, one end of each of at least two light emitting control signal lines are electrically connected to the same first shift register unit, and the other ends of the at least two light emitting control signal lines are electrically connected via one first connecting line.

Alternatively, in one embodiment, as shown in FIG. 9B, the second subarea A12 may further include at least two second connecting lines 620 insulated from each other. In the second subarea A12, one end of each of at least two second driving signal lines L_2 are electrically connected to a same second shift register unit SR (n)_2, and the other ends of the at least two second driving signal lines L_2 are electrically connected via one second connecting line 620. In this way, adverse influence on the displaying of the display panel, caused by floating of one end of a second driving signal lines L_2 extending to the edge of the second subarea A12 close to the middle area A10, can be avoided. Moreover, during the manufacturing and the use of the display panel, especially when the substrate is flexible, the display panel may be bent more easily, which may result in open circuits between the second driving signal lines and the second shift register units, thereby causing that the second driving signal lines in the open circuits cannot normally transmit a driving signal. In the embodiment of the present disclosure, since the second driving signal lines electrically connected to the same second shift register unit are electrically connected via a second connecting line, when one of the second driving signal lines is disconnected from the second shift register unit, a driving signal is transmitted to the disconnected second driving signal line by the second connecting line, so that the normal driving of the display panel can be ensured to realize the normal light-emitting displaying of the display panel.

In one embodiment, when a second driving signal line includes a gate line, one end of each of at least two gate lines are electrically connected to a same second shift register unit, and the other end of each of the at least two gate lines are electrically connected via one second connecting line. When a second driving signal line includes a light emitting control signal line, one end of each of at least two light emitting control signal lines are electrically connected to the same second shift register unit, and the other ends of the at least two light emitting control signal lines are electrically connected via one second connecting line.

In order to simultaneously avoid adverse influences on the displaying of the display panel, caused when one end of a first driving signal lines L_1 extending to the edge, close to the middle area A10, of the first subarea A11 floats and when one end of a second driving signal line L_2 extending to the edge, close to the middle area A10, of the second subarea A12 floats, in one embodiment, in the display panel according to the embodiment of the present disclosure, as shown in FIG. 9B, the first subarea A11 further includes at least two first connecting lines 610 insulated from each other, and the second subarea A12 further includes at least two second connecting lines 620 insulated from each other. In the first subarea A11, one end of each of the at least two first driving signal lines L_1 is connected to the same first shift register unit SR (n)_1, and the other ends of the at least two first driving signal lines L_1 are electrically connected via one first connecting line 610. In the second subarea A12, one end of each of at least two second driving signal lines L_2 are electrically connected to the same second shift register unit SR (n)_2, and the other ends of the at least two second driving signal lines L_2 are electrically connected via one second connecting line 620.

In one embodiment, in the display panel according to the embodiment of the present disclosure, a first shift register unit and a second shift register unit each include at least two switching transistors. When the display panel includes at least two first connecting lines, as shown in FIG. 11A and FIG. 11B, each first shift register unit includes a switching transistor 200 on the substrate 100. When the display panel includes at least two first connecting lines 610, each of the first connecting lines 610 may be made of the same material and configured at the same layer as the source 231 and the drain 232 of the switching transistor 200. In this way, when the switching transistor 200 are manufactured, it is only required to change the previous pattern during the formation of the source 231 and the drain 232 of the switching transistor 200, and then the pattern of the source 231 and the drain 232 of the switching transistor 200 and the first connecting lines 610 can be formed by performing a patterning process once, without need of an additional manufacturing process of the first connecting lines 610, thus simplifying the manufacturing process, saving production cost, and improving the production efficiency. Moreover, the first connecting lines 610 are electrically connected to corresponding first driving signal lines. In this case, the first connecting lines are insulated from the data lines and in order to prevent the data lines from short circuit, the first connecting lines generally extend along the column direction of the pixels.

Alternatively, when the first subarea includes at least two first connecting lines, in one embodiment, in the display panel according to the embodiment of the present disclosure, the first connecting lines may also be made of the same material and configured at the same layer as one terminal of the storage compactor. In this way, when one terminal of the storage compactor is prepared, it is only required to change the previous pattern during the formation of one terminal of the storage compactor, and then the pattern of one terminal of the storage compactor and the first connecting lines can be formed by performing a patterning process once, without need of an additional manufacturing process of the first connecting lines, thus simplifying the preparation process, saving production cost, and improving the production efficiency. Moreover, the first connecting lines are electrically connected to the corresponding first driving signal lines. In one embodiment, as shown in FIG. 11C, the first connecting lines 610 may be made of the same material and configured at the same layer as one terminal, i.e., the metal terminal 500, of the storage compactors Moreover, the first connecting lines 610 are insulated from the metal terminal 500.

Alternatively, when the first subarea includes at least two first connecting lines, in one embodiment, in the display panel according to the embodiment of the present disclosure, as shown in FIG. 11D, first connecting lines 610 may also be made of the same material and configured at the same layer as an anode 310. In this way, when a light-emitting element is prepared, it is only required to change the previous pattern during the formation of the anode 310, and then the pattern of the anode 310 and the first connecting lines 610 can be formed by performing a patterning process once, without need of an additional, manufacturing process of the first connecting lines 610, thus simplifying the manufacturing process, saving production cost, and improving the production efficiency. Moreover, the first connecting lines 610 are electrically connected to corresponding first driving signal lines. Moreover, the first connecting lines 610 are insulated from the anode 310.

Alternatively, when the first subarea includes at least two first connecting lines, in one embodiment, in the display panel according to the embodiment of the present disclosure, the first connecting lines may also be made of the same material and configured at the same layer as the first driving signal lines. In this way, when the display panel is prepared, it is only required to change the previous pattern during the formation of the first driving signal lines, and then the patterns of the first driving signal lines and the first connecting lines can be formed by performing a patterning process once, without need of additional manufacturing processes of the first connecting lines and via holes, thus simplifying the preparation process, saving production cost, and improving the production efficiency. In one embodiment, when each first driving signal line only includes a gate line, the first connecting lines and the gate lines are made of the same material and configured at the same layer. Alternatively, when each first driving signal line only includes a light emitting control signal line, the first connecting lines and the light emitting control signal lines are made of the same material and configured at the same layer. Alternatively, when each first driving signal line includes a gate line and a light emitting control signal line at the time, the first connecting lines electrically connected to the gate lines are made of the same material and configured at the same layer as the gate lines, the first connecting lines electrically connected to the light emitting control signal lines and the light emitting control signal lines are configured at different layers, and the light emitting control signal lines are connected to the corresponding first connecting lines through via holes. Alternatively, the first connecting lines electrically connected to the light emitting control signal lines are made of the same material and configured at the same layer as the light emitting control signal lines, the first connecting lines electrically connected to the gate lines and the gate lines are configured at different layers, and the gate lines are connected to the corresponding first connecting lines through via holes.

In one embodiment, in the display panel according to the embodiment of the present disclosure, a first shift register unit and a second shift register unit each include at least two switching transistors. When the display panel includes at least two second connecting lines, as shown in FIG. 11A and FIG. 11B, the second connecting lines 620 are made of the same material and configured at the same layer as the source 231 and the drain 232 of a switching transistor 200.

Alternatively, when the display panel includes at least two second connecting lines, in one embodiment, in the display panel according to the embodiment of the present disclosure, the second connecting lines may also be made of the same material and configured at the same layer as one terminal of the storage compactors. In one embodiment, as shown in FIG. 11C, the second connecting lines 620 may be made of the same material and configured at the same layer as one terminal, i.e., the metal terminal 500, of the storage compactors. Moreover, the second connecting lines 620 are insulated from the metal terminal 500.

Alternatively, when the display panel includes at least two second connecting lines, in one embodiment, in the display panel according to the embodiment of the present disclosure, as shown in FIG. 11D, the second connecting lines 620 may also be made of the same material and configured at the same layer as the node 310.

Alternatively, when the second subarea includes at least two second connecting lines, in one embodiment, in the display panel according to the embodiment of the present disclosure, the second connecting lines may also be made of the same material and configured at the same layer as the second driving signal lines. In order to further reduce the border of the display panel, in one embodiment, in the case where the first connecting lines and the anode are made of the same material and configured at the same layer and the second connecting lines and the anode are made of the same material and configured at the same layer, in the display panel according to the embodiment of the present disclosure, as shown in FIG. 9B, non-display dummy pixels DPX may be included at least at the edge, close to the middle area A10, of the first subarea A11 and at the edge, close to the middle area A10, of the second subarea A12. In the case where the first subarea A11 includes at least two first connecting lines 610, the orthographic projection of the first connecting lines 610 on the display panel overlaps the orthographic projection of the non-display dummy pixels DPX located at the edge, close to the middle area A10, of the first subarea A11, on the display panel. In the case where the second subarea A12 includes at least two second connecting lines 620, the orthographic projection of the second connecting lines 620 on the display panel overlap the orthographic projection of the non-display dummy pixels DPX located at the edge, close to the middle area A10, of the second subarea A12, on the display panel.

In order to prevent the static electricity generated on the first driving signal lines from adversely affecting the display panel, in one embodiment, in the display panel according to the embodiment of the present disclosure, as shown in FIG. 9B, when the first subarea A11 includes at least two first connecting lines 610, the first subarea A11 further includes at least two first electrostatic discharge circuits ESD_1, and each first connecting line 610 is correspondingly electrically connected with one first electrostatic discharge circuit ESD_1 respectively. In this way, the static electricity generated on the first driving signal lines L_1 connected to the first connecting lines 610 can be discharged to prevent the static electricity on the first driving signal lines L_1 from adversely affecting the display panel. In addition, compared with a method where an electrostatic discharge (ESD) circuit is configured for each of the first driving signal lines, when the number of electrostatic discharge circuits is set according to the number of the first connecting lines, the number of the electrostatic discharge circuits would be effectively reduced, the space occupied by the electrostatic discharge circuits is reduced and the border is narrower.

In order to prevent the static electricity generated on the first driving signal lines from adversely affecting the display panel, in one embodiment, in the display panel according to the embodiment of the present disclosure, as shown in FIG. 9B, when the second subarea A12 includes at least two second connecting lines 620, the second subarea A12 further includes at least two second electrostatic discharge circuits ESD_2, and each second connecting line 620 is correspondingly electrically connected with one second electrostatic discharge circuit ESD_2 respectively. In this way, the static electricity generated on the second driving signal line L_2 connected to the second connecting lines 620 can be discharged to prevent the static electricity on the second driving signal lines L_2 from adversely affecting the display panel. In addition, compared with a method where an electrostatic discharge (ESD) circuit is configured for each of the second driving signal lines, the method where the number of electrostatic discharge circuits is set according to the number of the second connecting lines effectively reduces the number of the electrostatic discharge circuits, reduces the space occupied by the electrostatic discharge circuits, and reduces the border.

In one embodiment, in the display panel according to the embodiment of the present disclosure, as shown in FIG. 3, the second area A2 of the display panel may include at least two pixels PX, a third driving signal line extending in the row direction of the pixels PX L_3, and a third driving circuit VSR_3 electrically connected to the third driving signal line L_3, where the third driving circuit VSR_3 is configured to drive the third driving signal line L_3 to drive the third driving signal line L_3 in the second area A2. The second area A2 is adjacent to the first subarea A11, the middle area A10, and the second subarea A12, respectively. In addition, as shown in FIG. 3, the second area A2 may have an outline of a rectangular area so as to be applied to a display device having a display function, such as a mobile phone or a tablet computer. Of course, the outline of the second area may also be a special-shaped area which may be an area having each of four rectangular corners of the rectangular area set into an arc shape, so as to be applied to a display device having a display function, such as a wearable wristwatch. In practice, the shape of the outline of the second area needs to be designed and determined according to the actual application environment, which is not limited herein.

In one embodiment, in the display panel according to the embodiment of the present disclosure, as shown in FIGS. 8A-9B, the third driving circuit VSR_3 may include at least two cascaded third shift register units SR (p)_3 (p=1, 2, 3, . . . P, where P is the total number of the cascade third shift register units, and all of FIGS. 8A-9B show an example of P=4); where each third shift register unit SR (p)_3 is electrically connected to a third clock signal line ck3, a third reference voltage signal line and at least one third driving signal line L_3, respectively. An input signal terminal In of the first-stage third shift register unit SR (1)_3 is connected to a third initial signal terminal STV_3, and the input signal terminals In of other stages of third shift register units SR(p)_3 are connected to driving signal output terminals Out of their adjacent previous stages of first shift register units SR (p−1)_3.

General display panels fulfill the displaying function in a way of single-sided driving or double-sided driving. In a display panel according to an embodiment of the present disclosure, as shown in FIGS. 8A-9B, the second area A2 may include two third driving circuits VSR_3a and VSR_3b, and the two third driving circuits VSR_3a and VSR_3b are respectively connected to the two ends of each third driving signal line L_3. The third shift register units SR (p)_3 in the two third driving circuits VSR_3a and VSR_3b are arranged in a one-to-one correspondence relationship, and the third shift register units SR (p)_3 which are correspondingly arranged output the same driving signal at the same time. In this way, the third driving signal lines L_3 in the second area A2 can fulfill the function of double-sided driving. In one embodiment, the third shift register units SR (p)_3 in the third driving circuit VSR_3a and the third shift register units SR (p)_3 in the third driving circuit VSR_3b are arranged in a one-to-one correspondence relationship.

Generally, a display panel can operate in a line-by-line driving mode or can also operate in an area-by-area driving mode. In one embodiment, when the second area includes two third driving circuits, in the display panel according to the embodiment of the present disclosure, as shown in FIG. 8A, the third initial signal terminal STV_3 may be an independent initial signal terminal and the initial signal of the third initial signal terminal STV_3 is different from the initial signals of the first initial signal terminal STV_1 and of the second initial signal terminal STV_2. In this way, the third initial signal terminal STV_3 can serve as an independent signal terminal and also can serve as a signal terminal configured to receive an initial signal input by an external circuit, so that the third driving circuit VSR_3 can operate independently from the first driving circuit VSR_1 and the second driving circuit VSR_2, so that the second area A2 can be driven independently from the first subarea A11 and the second subarea A12 to realize the area-by-area driving function of the display panel. For example, the first subarea A11 and the second subarea A12 may implement display functions such as displaying weather, time, simultaneous reminders, or brand logos when the second area A2 does not display an image. Furthermore, since the third driving circuit operates independently now, the third driving circuit may not be provided with a signal, so that a large part of the display panel (i.e., the second area) does not operate, thereby reducing the power consumption.

In order to make the display panel operate in a line-by-line driving mode to fulfill the display function, in one embodiment, when the second area includes two third driving circuits, in the display panel according to the embodiment of the present disclosure, the input signal terminal of the first-stage third shifter register unit is electrically connected to the driving signal output terminal of the last-stage first shift register unit in the first driving circuit. In this way, when the display panel displays an image, the first subarea in the first area can be better connected to the second area so that the pixels in the first subarea and the second area can be driven line by line stably. In one embodiment, as shown in FIG. 8B, the input signal terminal In of the first-stage third shift register unit SR (1)_3 in the third driving circuit VSR_3a on the left side of the display panel is electrically connected to the driving signal output terminal Out of the last-stage first stage shift register unit SR (N)_1 in the first driving circuit VSR_1. In addition, in this way, the number of initial signal terminals can be reduced, and the cost of the external circuit for inputting the initial signal can be lowered.

In one embodiment, when the second area includes two third driving circuits, in the display panel according to the embodiment of the present disclosure, the input signal terminal of the first-stage third shifter register unit is electrically connected to the driving signal output terminal of the last-stage second shift register unit in the second driving circuit. In this way, when the display panel displays an image, the second subarea in the first area can be better connected to the second area so that the pixels in the second subarea and the second area can be driven line by line stably. In one embodiment, as shown in FIG. 8B, the input signal terminal In of the first-stage third shift register unit SR (1)_3 in the third driving circuit VSR_3b on the right side of the display panel is electrically connected to the driving signal output terminal Out of the last-stage first stage shift register unit SR (N)_2 in the second driving circuit VSR_2. In addition, in this way, the number of initial signal terminals can be reduced, and the cost of the external circuit for inputting the initial signal can be lowered.

In one embodiment, when the second area includes two third driving circuits, in the display panel according to the embodiment of the present disclosure, as shown in FIG. 8B, the input signal terminal In of the first-stage third shift register unit SR (1)_3 in the third driving circuit VSR_3a on the left side of the display panel is electrically connected to the driving signal output terminal Out of the last-stage first stage shift register unit SR (N)_1 in the first driving circuit VSR_1. Moreover, the input signal terminal In of the first-stage third shift register unit SR (1)_3 in the third driving circuit VSR_3b on the right side of the display panel is electrically connected to the driving signal output terminal Out of the last-stage first stage shift register unit SR (N)_2 in the second driving circuit VSR_2. In this way, when the display panel displays an image, the first area can be better connected to the second area so that the pixels in the first area and the second area can be driven line by line stably.

In one embodiment, when the second area includes two third driving circuits, in order to reduce the load of the third driving circuits, in the display panel according to the embodiment of the present disclosure, as shown in FIG. 9B, each third driving signal line L_3 in the second area A2 is disconnected at a same gap between two adjacent columns of pixels PX to form a first driving sub-signal line L_31 and a second driving sub-signal line L_32 insulated from each other. One end of the first driving sub-signal line L_31 is electrically connected to the third driving circuit VSR_3a, and the other end of the first driving sub-signal line L_31 extends to the gap. In this way, the third driving circuit VSR_3a located on one side of the gap drives the first driving sub-signal line L_31 on the same side of the gap. Moreover, one end of the second driving sub-signal line L_32 is electrically connected to the other third driving circuit VSR_3b, and the other end of the second driving sub-signal line L_32 extends to the gap. In this way, the third driving circuit VSR_3b located on the other side of the gap can drive the second driving sub-signal line L_32 on the same other side of the gap. Because the first subarea and the second subarea respectively adopt a one-sided driving mode and the third driving signal lines are disconnected in the second area so that the third driving signal lines also adopt a one-sided driving mode, thus achieving better signal uniformity of the whole display panel.

In one embodiment, in the display panel according to the embodiment of the present disclosure, as shown in FIG. 9B, one end of each of the at least two first driving sub-signal lines L_31 is electrically connected to one third shift register unit SR (p)_3, and the second area A2 may further include at least two third connecting lines 630, where the other ends of the first driving sub-signal lines L_31 connected to the same third shift register unit SR (p)_3 are electrically connected to each other through a third connecting line 630. In this way, adverse influence on the displaying of the display panel, caused by floating of one end of the first driving sub-signal lines L_31 extending to the gap can be avoided. Moreover, during the manufacturing and the use of the display panel, especially when the substrate is flexible, the display panel may be more easily bent, which may result in an open circuit between the first driving sub-signal lines and the third shift register units, thereby causing that the disconnected first driving sub-signal lines cannot normally transmit a driving signal. In the embodiment of the present disclosure, since the first driving sub-signal lines electrically connected to the same third shift register unit are electrically connected by a third connecting line, when one of the first driving sub-signal lines is disconnected from the third shift register unit, a driving signal is transmitted to the disconnected first driving sub-signal line by the action of the third connecting line, so that the normal driving of the display panel can be ensured to realize the normal light-emitting displaying of the display panel.

In one embodiment, in the display panel according to the embodiment of the present disclosure, as shown in FIG. 9B, one end of each of at least two second driving sub-signal lines L_32 is electrically connected to one third shift register unit SR (p)_3, and the second area A2 further includes at least two fourth connecting lines 640. The other ends of the second driving sub-signal lines L_32 connected to the same third shift register unit SR (p)_3 are electrically connected to each other through a fourth connecting line 640.

In one embodiment, when the second area includes two third driving circuits, in the display panel according to the embodiment of the present disclosure, as shown in FIG. 7, when a first driving signal line L_1 and a second driving signal line L_2 each include a gate line Scan, the second area A2 may include gate lines Scan and two third gate driving circuits VSR_3a and VSR_3b, that is, each third driving signal line may only include a gate line Scan, and each of the two third driving circuits, i.e., the third driving circuits VSR_3a and VSR_3b, includes a third gate driving circuit VSR_31a or VSR_31b. The two third gate driving circuits VSR_31a and VSR_31b are connected to the two ends of each gate line Scan in the second area A2, that is, the two third gate driving circuits VSR_31a and VSR_31b are respectively located at two sides of the second area A2. Moreover, when the first driving circuit VSR_1 includes a first gate driving circuit VSR_11, the first gate driving circuit VSR_11 is connected to one end, away from the middle area A10, of each of the gate lines Scan in the first subarea A11. And when the second driving circuit VSR_2 includes a second gate driving circuit VSR_21, the second gate driving circuit VSR_21 is connected to one end, away from the middle area A10, of each of the gate lines Scan in the second subarea A12. Moreover, in one embodiment, the input signal terminal of the first-stage third shift register unit in the third gate driving circuit on the left side of the display panel may be electrically connected to the driving signal output terminal of the last-stage first shift register unit in the first gate driving circuit. The input signal terminal of the first-stage third shift register unit in the third gate driving circuit on the right side of the display panel may be electrically connected to the driving signal output terminal of the last-stage second shift register unit in the second gate driving circuit.

In one embodiment, when the second area includes two third driving circuits, in the display panel according to the embodiment of the present disclosure, as shown in FIG. 7, when the first driving signal lines L_1 and the second driving signal lines L_2 each include a light emitting control signal line Emit, the second area A2 may include light emitting control signal lines Emit and two third light emitting driving circuits VSR_32a and VSR_32b, that is, each third driving signal line L_3 may only include a light emitting control signal line Emit, and each of the two third driving circuits, i.e., the third driving circuits VSR_3a and VSR_3b, includes one third light emitting driving circuit VSR_32a or VSR_32b, and the two third light emitting driving circuits VSR_32a and VSR_32b are respectively connected to two ends of each light emitting control signal line Emit in the second area A2, that is, the two third light emitting driving circuits VSR_32a and VSR_32b are respectively located at two sides of the second area A2. Moreover, when the first driving circuit VSR_1 includes a first light emitting driving circuit VSR_12, the first light emitting driving circuit VSR_12 is connected to one end, away from the middle area A10, of each of the light emitting control signal lines Emit in the first subarea A11. And when the second driving circuit VSR_2 includes a second light emitting driving circuit VSR_22, the second light emitting driving circuit VSR_22 is connected to one end, away from the middle area A10, of the light emitting control signal lines Emit in the second subarea A12. In one embodiment, the input signal terminal of the first-stage third shift register unit in the third light emitting driving circuit on the left side of the display panel may be electrically connected to the driving signal output terminal of the last-stage first shift register unit in the first light emitting driving circuit. The input signal terminal of the first-stage third shift register unit in the third light emitting driving circuit on the right side of the display panel is electrically connected to the driving signal output terminal of the last-stage second shift register unit in the second light emitting driving circuit.

Of course, in one embodiment, when the second area includes two third driving circuits, in the display panel according to the embodiment of the present disclosure, as shown in FIG. 7, when the first driving signal lines L_1 and the second driving signal lines L_2 each include both a gate line Scan and a light emitting control signal line Emit, the second area A2 may include gate lines Scan, light emitting control signal lines Emit, two third gate driving circuits VSR_31a and VSR_31b, and two third light emitting driving circuits VSR_32a and VSR_32b, that is, each third driving signal line may include a gate line and a light emitting control signal line, the third driving circuit VSR_3a includes a third gate driving circuit VSR_31a and a third light emitting driving circuit VSR_32a, and the third driving circuit VSR_3b includes a third gate driving circuit VSR_31b and a third light emitting driving circuit VSR_32b. The two third gate driving circuits VSR_318a and VSR_31b are respectively connected to two ends of each gate line Scan in the second area A2 and the two third light emitting driving circuits VSR_32a and VSR_32b are respectively connected to two ends of each light emitting control signal line Emit in the second area A2.

For the purpose of a unified manufacturing process, in one embodiment, in the display panel according to the embodiment of the present disclosure, the structure of the third shift register units may be the same as the structure of the first shift register units. Certainly, the structure of a third shift register unit may also be different from the structure of a first shift register units. In a practical application, the structures of the third shift register units and the first shift register units need to be determined according to the actual application environment, which is not limited herein.

In one embodiment, when the structure of the third shift register units is the same as the structure of the first shift register units, in the display panel according to the embodiment of the present disclosure, the structure of the third shift register units may be as shown in FIG. 10. With reference to FIGS. 8A-10, the third clock signal line ck3 electrically connected to the third driving circuit VSR_3a may include two clock sub-signal lines which are a fifth clock sub-signal line ck3a and a sixth clock sub-signal line ck3b, respectively, and clock signals transmitted on the two clock sub-signal lines are the same in cycle and in duty cycle. where the first clock signal terminal CK1 of the (2y−1)-th-stage third shift register unit SR (2y−1)_3 and the second clock signal terminal CK2 of the 2y-th-stage third shift register unit SR (2y)_3 are both electrically connected to the same clock sub-signal line, that is, are both electrically connected to the fifth clock sub-signal line ck3a. The second clock signal terminal CK2 of the (2y−1)-th-stage third shift register unit SR (2y−1)_3 and the first clock signal terminal CK1 of the 2y-th-stage third shift register unit SR (2y)_3 are both electrically connected to the same clock sub-signal line, that is, are both electrically connected to the sixth clock sub-signal line ck3b, where y is a positive integer. Furthermore, each third reference voltage signal line may include two reference voltage sub-signal lines, and the two reference voltage sub-signal lines are a fifth reference voltage sub-signal line and a sixth reference voltage sub-signal line, respectively. In one embodiment, the first reference voltage signal terminal vref1 of each stage of the first shift register unit may be electrically connected to the fifth reference voltage sub-signal line, and the second reference voltage signal terminal vref2 of each stage of the third shift register unit may be electrically connected to the sixth reference voltage sub-signal line. In a practical application, one of the fifth reference voltage sub-signal line and the sixth reference voltage sub-signal line is used to transmit a high-voltage reference signal and the other reference voltage sub-signal line is used to transmit a low-voltage reference signal.

In addition, in order to further reduce the number of signal lines and reduce the occupied area of the signal lines, in one embodiment, when the potentials of the clock signals transmitted on the first clock sub-signal line and the fifth clock sub-signal line are the same, the first clock sub-signal line and the fifth clock sub-signal line on the left side of the display panel are set as one clock sub-signal line. When the potentials of the clock signals transmitted on the second clock sub-signal line and the sixth clock sub-signal line are the same, the second clock sub-signal line and the sixth clock sub-signal line on the left side of the display panel may be set as one clock sub-signal line. Similarly, other clock sub-signal lines are also set based on the same principle, which should be understood by those of ordinary skill in the art, and details are not described herein again.

Figure 12:
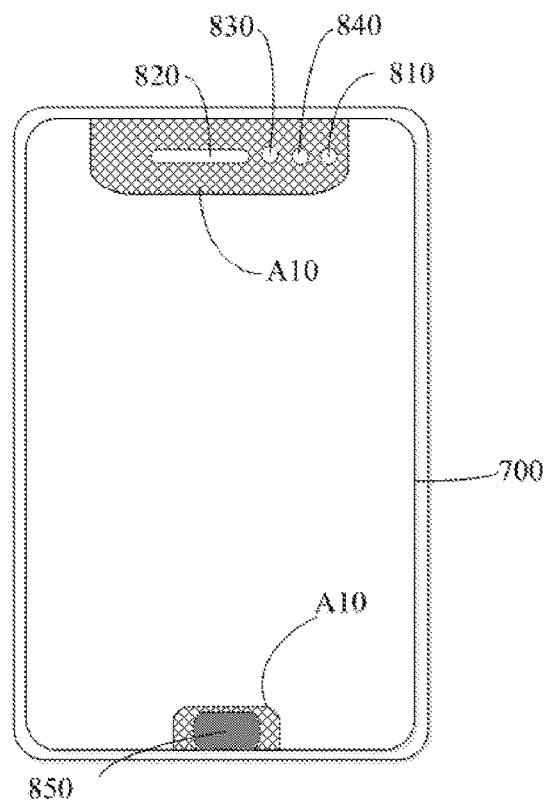
FIG. 12 is a structural schematic diagram of a display device according to an embodiment of the present disclosure.

Based on the same inventive concept, an embodiment of the present disclosure further provides a display device. As shown in FIG. 12, the display device may include any one of the above display panels 700 according to the embodiments of the present disclosure. The principle of the display device to solve the problem is similar to the principles of the foregoing display panels. Therefore, for the implementation of the display device, reference may be made to the implementation of the foregoing display panels, and details are not described herein again.

In one embodiment, in the display device according to the embodiment of the present disclosure, the display device may further include one or a combination of a camera, a receiver, a light sensor, a distance sensor, an iris recognition sensor, and a fingerprint recognition sensor; where the orthographic projection of one or a combination of the camera, the receiver, the light sensor, the distance sensor, the iris recognition sensor and the fingerprint recognition sensor, included in the display device, on the display panel is located within the orthographic projection of the middle area on the display panel.

In one embodiment, in the display device according to the embodiment of the present disclosure, as shown in FIG. 12 (FIG. 12 only show a display panel including a camera, a receiver, a light sensor, a fingerprint recognition sensor and a distance sensor as an example), the display device including a camera 810, a receiver 820, a light sensor 830, a distance sensor 840 and a fingerprint recognition sensor 850, and the orthographic projections of the camera 810, the receiver 820, the light sensor 830, the distance sensor 840 and the fingerprint recognition sensor 850 on the display panel 700 are all located within the orthographic projection of the middle area A10 on the display panel 700. Moreover, in order to avoid affecting the operation performances of the devices such as the camera 810, the receiver 820, the light sensor 830, the distance sensor 840 and the fingerprint identification sensor 850, the middle area A10 is generally configured as a hollow area.

In one embodiment, the display device according to the embodiment of the present disclosure may be a mobile phone as shown in FIG. 12. Of course, the display device according to the embodiment of the present disclosure may also be any product or component having a display function, such as a mobile phone, a tablet computer, a television, a display, a notebook computer, a digital photo frame and a navigator. It should be understood by those of ordinary skill in the art that other indispensable components of the display device are included, which will not be described in detail herein again and should not be construed as limiting the present disclosure.

In the display panel and the display device according to the embodiments of the present disclosure, since the middle area is arranged between the first subarea and the second subarea, when the display panel is applied to the display device, components such as a front camera and a receiver can be arranged at corresponding positions in the middle area, and further the screen-to-body ratio of the display panel can be increased as compared with that of a conventional display panel. Furthermore, the first driving signal lines located in the first subarea only extend along the row direction of the pixels to the edge of the first subarea close to the middle area, and the second driving signal lines located in the second subarea only extend to the edge of the second subarea close to the middle area. In addition, since the first subarea and the second subarea are separated by the middle area so that the first subarea and the second subarea are not adjacent to each other and therefore the first driving signal lines and the second driving signal lines can be insulated from each other and are only arranged in the first subarea and the second subarea respectively, without occupying areas between the first subarea and the middle area, between the second subarea and the middle area, and between the second area and the middle area. Moreover, the first driving circuit is arranged in the first subarea to drive the first driving signal lines to work and the second driving circuit is arranged in the second subarea to drive the second driving signal lines to work, thereby ensuring the normal driving operation of the first driving signal lines and the second driving signal lines. Therefore, the problem that in order to implement electric connection for normal drive, the first driving signal lines and the second driving signal lines occupy extra non-display areas which are arranged between the middle area and the first subarea, between the middle area and the second subarea and between the middle area and the second area and are used for arranging signal lines, can be avoided, and the occupied area of the non-display areas can be reduced and further the narrow bezel design of the display panel can be realized.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

What is claimed is:

1. A display panel, comprising:
a first area and a second area, wherein the first area comprises a middle area, a first subarea and a second subarea, the first subarea and the second subarea are separated by the middle area;
the first subarea comprises at least two pixels, one or more first driving signal lines extending in a row direction of the pixels and a first driving circuit; wherein one end of at least one of the first driving signal lines is electrically connected to the first driving circuit and the other end of the first driving signal line extends to an edge of the first subarea close to the middle area; and the first driving circuit is configured to drive the first driving signal lines located in the first subarea;
the second subarea comprises at least two pixels, one or more second driving signal lines extending in the row direction of the pixels and a second driving circuit; wherein one end of at least one of the second driving signal lines is electrically connected to the second driving circuit and the other end of the second driving signal line extends to an edge of the second subarea close to the middle area; and the second driving circuit is configured to drive the second driving signal lines located in the second subarea;
wherein the first driving circuit comprises at least two cascaded first shift register units, wherein each of the first shift register units is respectively electrically connected with a first clock signal line, a first reference voltage signal line and at least one first driving signal line correspondingly, and an input signal terminal of a first-stage first shift register unit is connected to a first initial signal terminal, and an input signal terminal of each of other stages of first shift register units is connected to a driving signal output terminal of its adjacent previous stage of first shift register unit; and
the second driving circuit comprise at least two cascaded second shift register units, wherein each of the second shift register units is respectively electrically connected with a second clock signal line, a second reference voltage signal line and at least one second driving signal line correspondingly, and an input signal terminal of a first-stage second shift register unit is connected to a second initial signal terminal, and an input signal terminal of each of other stages of second shift register units is respectively connected to a driving signal output terminal of its adjacent previous stage of second shift register unit;
wherein the first subarea further comprises at least two first connecting lines insulated from each other; or the second subarea further comprises at least two second connecting lines insulated from each other;
in the first subarea, one end of each of at least two first driving signal lines is correspondingly electrically connected to a same first shift register unit, and the other ends of the at least two first driving signal lines are electrically connected via one first connecting line;
in the second subarea, one end of each of at least two second driving signal lines is correspondingly electrically connected to a same second shift register unit, and the other ends of the at least two second driving signal lines are electrically connected via one second connecting line.

2. The display panel according to claim 1, wherein the first shift register units located in the first subarea correspond to the second shift register units located in the second subarea in a one to one relationship and a first shift register unit and a second shift register unit which are correspondingly arranged simultaneously output a same driving signal.

3. The display panel according to claim 2, further comprising a first wire, the first initial signal terminal and the second initial signal terminal being electrically connected with each other through the first wire.

4. The display panel according to claim 3, further comprising at least two second wires and at least two third wires, the second wires and the third wires both insulated from the first wires and the second wires insulated from the third wires;
clock control signal lines with a same period and a same phase in the first clock control signal line and in the second clock control signal line are electrically connected to each other through one second wire; and
reference voltage signal lines of a same voltage in the first reference voltage signal line and the second reference voltage signal line are electrically connected to each other through one third wire.

5. The display panel according to claim 4, wherein the first wire, the second wires and the third wires are all arranged along an edge of the first subarea, an edge of the second subarea and an edge of the second area close to the middle area.

6. The display panel according to claim 4, wherein the first shift register units and the second shift register units each comprise at least two switching transistors, wherein
each of the pixels comprises a light-emitting element and a pixel compensation circuit electrically connected to the light-emitting element; the pixel compensation circuit at least comprises a storage capacitor; at least one kind of the first wire, the second wire and the third wire is made of a same material and configured at a same layer as gates of the switching transistors; or, at least one kind of the first wire, the second wire and the third wire is made of a same material and configured at a same layer as one terminal of the storage capacitor; or,
at least one kind of the first wire, the second wire and the third wire is made of a same material and configured at a same layer as sources and drains of the switching transistors.

7. The display panel according to claim 4, wherein each of the pixels comprises a light-emitting element and a pixel compensation circuit electrically connected to the light-emitting element; the light-emitting element comprises an anode, an electroluminescent layer and a cathode that are stacked one above another;
at least one kind of the first wire, the second wire and the third wire is made of a same material and configured at a same layer as the anode;
the display panel further comprises non-display dummy pixels at a part of an edge of the first subarea and at a part of an edge of the second subarea; and
an orthographic projection of at least one kind of the first wire, the second wire and the third wire on the display panel and an orthographic projection of the non-display dummy pixels on the display panel overlap.

8. The display panel according to claim 1, wherein each of the pixels comprises a light-emitting element and a pixel compensation circuit electrically connected to the light-emitting element; the pixel compensation circuit at least comprises a storage capacitor; the first shift register units and the second shift register units each comprise at least two switching transistors;
when the display panel comprises at least two first connecting lines, the first connecting lines are made of a same material and configured at a same layer as sources and drains of the switching transistors; or the first connecting lines are made of a same material and configured at a same layer as one terminal of the storage capacitor; or,
when the display panel comprises at least two second connecting lines, the second connecting lines are made of a same material and configured at a same layer as sources and drains of the switching transistors; or the second connecting lines are made of a same material and configured at a same layer as one terminal of the storage capacitor; or
when the first subarea comprises at least two first connecting lines, the first connecting lines and the first driving signal lines are made of a same material and configured at a same layer; or
when the second subarea comprises at least two second connecting lines, the second connecting lines and the second driving signal lines are made of a same material and configured at a same layer.

9. The display panel according to claim 1, wherein each of the pixels comprises a light-emitting element and a pixel compensation circuit electrically connected to the light-emitting element; the light-emitting element comprises an anode, an electroluminescent layer and a cathode that are stacked one above another;

when the display panel comprises at least two first connecting lines, the first connecting lines and the anode are made of a same material and configured at a same layer; or
when the display panel comprises at least two second connecting lines, the second connecting lines and the anode are made of a same material and configured at a same layer;
the display panel further comprises non-display dummy pixels at least at an edge of the first subarea close to the middle area and at an edge of the second subarea close to the middle area; and
when the first subarea comprises at least two first connecting lines, orthographic projections of the first connecting lines on the display panel overlap orthographic projections of non-display dummy pixels located at the edge of the first subarea close to the middle area on the display panel; or
when the second subarea comprises at least two second connecting lines, orthographic projections of the second connecting lines on the display panel overlap orthographic projections of non-display dummy pixels located at the edge of the second subarea close to the middle area on the display panel.

10. The display panel according to claim 1, wherein when the first subarea comprises at least two first connecting lines, the first subarea further comprises at least two first electrostatic discharge circuits, and each of the first connecting lines is correspondingly electrically connected to one first electrostatic discharge circuit;
when the second subarea comprises at least two second connecting lines, the second subarea further comprises at least two second electrostatic discharge circuits, and each of the second connecting lines is correspondingly electrically connected to one second electrostatic discharge circuit.

11. The display panel according to claim 1, wherein each of the first shift register units is located on a same side of the first subarea and each of the second shift register units is located on a same side of the second subarea.

12. The display panel according to claim 11, wherein the first shift register units are located at a side of the first subarea away from the middle area and the second shift register units are located at a side of the second subarea away from the middle area.

13. The display panel according to claim 1, wherein the second area comprises at least two pixels, a third driving signal line extending along the row direction of the pixels, and a third driving circuit electrically connected with the third driving signal line, wherein the third driving circuit is configured to drive the third driving signal line.

14. The display panel according to claim 13, wherein the third driving circuit comprises at least two cascaded third shift register units, wherein each of the third shift register units is respectively electrically connected with a third clock signal line, a third reference voltage signal line and at least one third driving signal line correspondingly;
an input signal terminal of a first-stage third shift register unit is connected to a third initial signal terminal, and an input signal terminal of each of other stages of third shift register units is respectively connected to driving a signal output terminal of its adjacent previous stage of third shift register unit.

15. The display panel according to claim 14, wherein the third initial signal terminal is an independent initial signal terminal; and an initial signal of the third initial signal terminal is different from initial signals of the first initial signal terminal and the second initial signal terminal.

16. The display panel according to claim 14, wherein an input signal terminal of a first-stage third shift register unit is electrically connected to a driving signal output terminal of a last-stage first shift register unit in the first driving circuit; or the input signal terminal of the first-stage third shift register unit is electrically connected to a driving signal output terminal of a last-stage second shift register unit in the second driving circuit.

17. The display panel according to claim 14, wherein the second area comprises two third driving circuits which are electrically connected to two ends of the third driving signal lines respectively;

third shift register units in the two third driving circuits are arranged in a one-to-one corresponding relationship and third shift register units which are arranged correspondingly output a same driving signal at the same time.

18. The display panel according to claim 17, wherein the third driving signal lines in the second area are disconnected at a same gap between two adjacent columns of pixels to form first driving sub-signal lines and second driving sub-signal lines insulated from each other;

one end of each of the first driving sub-signal lines is electrically connected to one of the two third driving circuits, and the other end of each of the first driving sub-signal lines extends to the gap;

one end of each of the second driving sub-signal lines is electrically connected to the other one of the two third driving circuits, and the other end of each of the second driving sub-signal lines extends to the gap;

one end of each of at least two first driving sub-signal lines is electrically connected to a same third shift register unit, and the second area further comprises at least two third connecting lines, wherein the other ends of the first driving sub-signal lines connected to the same third shift register unit are electrically connected to each other via one third connecting line; or, one end of each of at least two second driving sub-signal lines is electrically connected to a same third shift register unit, and the second area further comprises at least two fourth connecting lines, wherein the other ends of the second driving sub-signal lines connected to the same third shift register unit are electrically connected to each other via one fourth connecting line.

19. The display panel according to claim 1, wherein the first driving signal lines and the second driving signal lines each comprise a gate line, the first driving circuit comprises a first gate driving circuit, and the second driving circuit comprises a second gate driving circuit; or, the first driving signal lines and the second driving signal lines each comprise a light emitting control signal line, the first driving circuit comprises a first light emitting driving circuit, and the second driving circuit comprises a second light emitting driving circuit.

20. The display panel according to claim 1, further comprising a substrate on which the pixels are arranged, the middle area being a hollow area of the subarea; or an outline of the middle area is a rectangle, or the outline of the middle area is special-shaped.

21. A display device, comprising:
the display panel according to claim 1,
the display device further comprises one or a combination of a camera, a receiver, a light sensor, a distance sensor, an iris recognition sensor and a fingerprint recognition sensor;
an orthographic projection of one or a combination of the camera, the receiver, the light sensor, the distance sensor, the iris recognition sensor and the fingerprint recognition sensor in the display device on the display panel is located within the orthographic projection of the middle area on the display panel.

22. A display panel, comprising:
a first area and a second area, wherein the first area comprises a middle area, a first subarea and a second subarea, the first subarea and the second subarea are separated by the middle area;
the first subarea comprises at least two pixels, one or more first driving signal lines extending in a row direction of the pixels and a first driving circuit wherein one end of at least one of the first driving signal lines is electrically connected to the first driving circuit and the other end of the first driving signal line extends to an edge of the first subarea close to the middle area; and the first driving circuit is configured to drive the first driving signal lines located in the first subarea;
the second subarea comprises at least two pixels, one or more second driving signal lines extending in the row direction of the pixels and a second driving circuit wherein one end of at least one of the second driving signal lines is electrically connected to the second driving circuit and the other end of the second driving signal line extends to an edge of the second subarea close to the middle area; and the second driving circuit is configured to drive the second driving signal lines located in the second subarea;
wherein the first driving signal lines and the second driving signal lines each comprise a gate line, the first driving circuit comprises a first gate driving circuit, and the second driving circuit comprises a second gate driving circuit or,
the first driving signal lines and the second driving signal lines each comprise a light emitting control signal line, the first driving circuit comprises a first light emitting driving circuit, and the second driving circuit comprises a second light emitting driving circuit;
wherein when the first driving signal lines and the second driving signal lines each comprise a gate line, the second area comprises a gate line and two third gate driving circuits which are connected to two ends of the gate line in the second area respectively;
the first gate driving circuit is connected to one end of the gate line in the first subarea away from the middle area;
the second gate driving circuit is connected to one end of the gate line in the second subarea away from the middle area.

23. A display panel, comprising:
a first area and a second area, wherein the first area comprises a middle area, a first subarea and a second subarea, the first subarea and the second subarea are separated by the middle area;
the first subarea comprises at least two pixels, one or more first driving signal lines extending in a row direction of the pixels and a first driving circuit wherein one end of at least one of the first driving signal lines is electrically connected to the first driving circuit and the other end of the first driving signal line extends to an edge of the first subarea close to the middle area; and the first driving circuit is configured to drive the first driving signal lines located in the first subarea;

the second subarea comprises at least two pixels, one or more second driving signal lines extending in the row direction of the pixels and a second driving circuit wherein one end of at least one of the second driving signal lines is electrically connected to the second driving circuit and the other end of the second driving signal line extends to an edge of the second subarea close to the middle area; and the second driving circuit is configured to drive the second driving signal lines located in the second subarea;

wherein the first driving signal lines and the second driving signal lines each comprise a gate line, the first driving circuit comprises a first gate driving circuit, and the second driving circuit comprises a second gate driving circuit or, the first driving signal lines and the second driving signal lines each comprise a light emitting control signal line, the first driving circuit comprises a first light emitting driving circuit, and the second driving circuit comprises a second light emitting driving circuit;

wherein when the first driving signal line and the second driving signal line each comprise a light emitting control signal line, the second area comprises a light emitting control signal line and two third light emitting driving circuits which are connected to two ends of the light emitting control signal lines in the second area respectively;

the first light emitting driving circuit is connected to one end of the light emitting control signal line in the first subarea away from the middle area;

the second light emitting driving circuit is connected to one end of the light emitting control signal lines in the second subarea away from the middle area.

24. A display panel, comprising:

a first area and a second area, wherein the first area comprises a middle area, a first subarea and a second subarea, the first subarea and the second subarea are separated by the middle area;

the first subarea comprises at least two pixels, one or more first driving signal lines extending in a row direction of the pixels and a first driving circuit wherein one end of at least one of the first driving signal lines is electrically connected to the first driving circuit and the other end of the first driving signal line extends to an edge of the first subarea close to the middle area; and the first driving circuit is configured to drive the first driving signal lines located in the first subarea;

the second subarea comprises at least two pixels, one or more second driving signal lines extending in the row direction of the pixels and a second driving circuit wherein one end of at least one of the second driving signal lines is electrically connected to the second driving circuit and the other end of the second driving signal line extends to an edge of the second subarea close to the middle area; and the second driving circuit is configured to drive the second driving signal lines located in the second subarea;

the display panel further comprising non-display dummy pixels at least at an edge of the first subarea close to the middle area and at least at an edge of the second subarea close to the middle area.

* * * * *